(12) United States Patent
Hatakeyama et al.

(10) Patent No.: US 8,288,072 B2
(45) Date of Patent: Oct. 16, 2012

(54) RESIST LOWER LAYER FILM-FORMED SUBSTRATE

(75) Inventors: Jun Hatakeyama, Niigata (JP); Kazumi Noda, Niigata (JP); Seiichiro Tachibana, Niigata (JP); Takeshi Kinsho, Niigata (JP); Tsutomu Ogihara, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 970 days.

(21) Appl. No.: 12/071,806

(22) Filed: Feb. 26, 2008

(65) Prior Publication Data
US 2008/0227037 A1 Sep. 18, 2008

(30) Foreign Application Priority Data
Mar. 13, 2007 (JP) .................................. 2007-63935

(51) Int. Cl.
*G03F 7/004* (2006.01)

(52) U.S. Cl. ............... 430/270.1; 430/271.1; 430/272.1; 430/273.1; 430/905; 430/907; 526/245; 526/246

(58) Field of Classification Search ............... 430/270.1, 430/271.1, 272.1, 512, 905, 907; 526/245, 526/246
See application file for complete search history.

(56) References Cited

U.S. PATENT DOCUMENTS

| | | | |
|---|---|---|---|
| 7,687,228 B2 * | 3/2010 | Hatakeyama et al. ......... 430/323 |
| 8,039,201 B2 * | 10/2011 | Yao et al. .................... 430/271.1 |
| 2005/0208419 A1 * | 9/2005 | Inabe et al. ................. 430/270.1 |
| 2006/0234154 A1 * | 10/2006 | Nishimura et al. ......... 430/270.1 |
| 2006/0234158 A1 * | 10/2006 | Hatakeyama .............. 430/270.1 |
| 2007/0026339 A1 * | 2/2007 | Allen et al. ................. 430/270.1 |
| 2008/0220381 A1 * | 9/2008 | Hatakeyama et al. ........ 430/326 |
| 2009/0130591 A1 * | 5/2009 | Yao et al. .................... 430/270.1 |

FOREIGN PATENT DOCUMENTS

| | | | |
|---|---|---|---|
| JP | A-09-073173 | | 3/1997 |
| JP | A-2000-294504 | | 10/2000 |
| JP | A-2000-336121 | | 12/2000 |
| JP | 2002220416 | * | 9/2002 |
| JP | A-2007-017949 | | 1/2007 |

OTHER PUBLICATIONS

Tom Lynch et al; "Properties and Performance of Near UV Reflectivity Control Layers;" *SPIE* vol. 2195; pp. 225-229.

* cited by examiner

*Primary Examiner* — John Chu
(74) *Attorney, Agent, or Firm* — Oliff & Berridge, PLC

(57) ABSTRACT

A resist lower layer film composition, wherein an etching speed is fast, thus an etching time period can be shortened to minimize a film thickness loss of a resist pattern and a deformation of the pattern during etching, therefore, a pattern can be transferred with high accuracy and an excellent pattern can be formed on a substrate is provided.

The resist lower layer film composition comprising at least a polymer having a repeating unit represented by the following general formula (1).

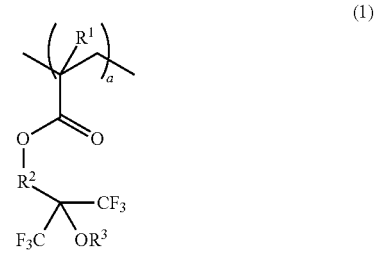

(1)

8 Claims, No Drawings

RESIST LOWER LAYER FILM-FORMED SUBSTRATE

BACKGROUND OF THE INVENTION

1. Field of the Invention

The present invention relates to a resist lower layer film composition for a multilayer resist film used for microfabrication in a process for manufacturing semiconductor devices etc., and particularly relates to a resist lower layer film composition suitable for exposure by far ultraviolet ray, KrF excimer laser light (248 nm), ArF excimer laser light (193 nm), $F_2$ laser light (157 nm), $Kr_2$ laser light (146 nm), $Ar_2$ laser light (126 nm), soft X ray, an electron beam, an ion beam, X ray and the like. Furthermore, the present invention relates to a patterning process for patterning a substrate using the resist lower layer film composition with lithography.

2. Description of the Related Art

In recent years, with advanced high integration and speed up of LSI, it has been required to make a pattern rule finer. In such a circumstance, in lithography using light exposure currently used as common technology, an essential resolution derived from a wavelength of a light source has been approaching a limit.

There is widely used optical exposure using g line (436 nm) or i line (365 nm) of a mercury-vapor lamp as a light source for lithography when a resist pattern is formed. It has been considered that a method of using an exposure light with a shorter wavelength is effective as a means for obtaining a further finer pattern. For this reason, for example, KrF excimer laser (248 nm) with a shorter wavelength is used as an exposure light source instead of i line (365 nm) for mass-production process of a 64 M bit DRAM processing method. However, a light source with far shorter wavelength is needed to manufacture DRAM with integration degree of 1 G or more which needs still finer processing techniques (for example, a processing size is 0.13 μm or less). Accordingly, lithography with ArF excimer laser (193 nm) has been particularly examined.

As the resist film has been made thinner, materials capable of being etched at a considerably higher speed are required for ordinary organic antireflection films compared with the resist. The organic antireflection film where the etching speed is enhanced by changing a base resin from a novolak type to a (meth)acryl type and further to a polyester type has been developed.

In the resist pattern after the exposure and the development on a mask substrate of Cr and the like, in the positive type photoresist, a problem that a substrate interface becomes a footing profile has occurred. It is believed that this is caused by diffusing the acid generated in the photoresist due to the exposure in the mask substrate of Cr or the like to reduce an acid concentration in the photoresist near the substrate. In order to reduce the occurrence of the footing profile, the improvement has been performed by using a protecting group having a low activation energy for a deprotection reaction with the acid, but this is not sufficient. To reduce the occurrence of the footing profile, it is effective to use an organic film between the photoresist and the Cr substrate.

An antireflection function is necessary in the case of the optical exposure, but in depiction of the mask pattern, the antireflection function is not particularly needed because the electron beam (EB) is used. Required are an excellent acid block function and a high etching speed for not diffusing the acid generated in the photoresist to the substrate.

Here, a resist lower layer material containing a polymer having α-hydroxymethyl acrylate as a repeating unit is disclosed (see Japanese patent Lapid-open (Kokai) No. 2007-17949). However, an organic film which has the higher etching speed has been required.

SUMMARY OF THE INVENTION

The present invention has been accomplished to solve the above-mentioned problems, and an object of the present invention is to provide a resist lower layer film composition for a monolayer resist process and a multilayer resist process, which can also be used as an antireflection film composition suitably, has a high dry etching speed and thus can shorten an etching time period to prevent a film loss and a transformation of an upper layer resist film, and a patterning process for patterning a substrate by using the resist layer film composition with lithography.

The present invention has been accomplished for solving the above-mentioned problems, and provides a resist lower layer film composition comprising: at least a polymer having a repeating unit represented by the following general formula (1),

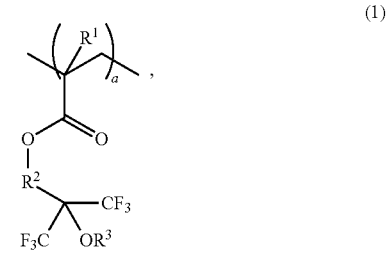

wherein $R^1$ represents a hydrogen atom or a methyl group; $R^2$ represents a linear or branched alkylene group having 1-8 carbon atoms; $R^3$ represents a hydrogen atom or an acid labile group; and $0 < a \leq 1.0$.

On the resist lower layer film formed from such a resist lower layer film composition, the dry etching speed is fast in transfer of a resist pattern after development. Thus, the dry etching time period can be shortened and the film loss of the upper layer resist film during the dry etching can be minimized. Therefore, the resist pattern can be transferred with high accuracy, and an excellent pattern can be formed.

In this case, the resist lower layer film composition may serve as an antireflection film composition.

This way, the resist lower layer film composition can be used as an antireflection film composition in photolithography. The resist lower layer film formed from this serves as the antireflection film, and thus, a halation and a stationary wave caused by reflection upon exposure can be inhibited to form an excellent resist pattern.

The polymer can further comprise a repeating unit having a light absorbing group of an aromatic group.

The aromatic group is highly light-absorbable, and if an antireflection film composition comprising such a polymer is used, the antireflection film having an appropriate antireflection function can be formed.

It is preferable that the resist lower layer film composition further contains one or more of an organic solvent, an acid generator and a crosslinking agent.

If the resist lower layer film composition further contains the organic solvent, an application property of the resist lower layer film composition can be further enhanced. If the resist lower layer film composition further contains one or more of the acid generator and the crosslinking agent, a crosslinking reaction in the resist lower layer film can be facilitated by baking after applying on the substrate. Therefore, a dense film can be obtained, there is little possibility of intermixing with the resist upper layer film, and there is few diffusion of low molecular components into the resist upper layer film or the like. As a result, an excellent resist pattern can be obtained, and an excellent pattern can be formed on the substrate.

It is preferable that the acid generator is an ammonium salt represented by the following general formula (2),

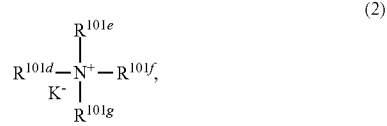

(2)

wherein $R^{101d}$, $R^{101e}$, $R^{101f}$ and $R^{101g}$ each represent a hydrogen atom, a linear, branched or cyclic alkyl, alkenyl, oxoalkyl or oxoalkenyl group having 1-12 carbon atoms, an aryl group having 6-20 carbon atoms, or an aralkyl or aryloxoalkyl group having 7-12 carbon atoms where a part of or all of hydrogen atoms may be substituted with a alkoxy group(s); $R^{101d}$ and $R^{101e}$, or $R^{101d}$, $R^{101e}$ and $R^{101f}$ may form a ring, and when forming the ring, $R^{101d}$ and $R^{101e}$, or $R^{101d}$, $R^{101e}$ and $R^{101f}$ each represent an alkylene group having 3-10 carbon atoms or a heteroaromatic ring having a nitrogen atom in the formula in the ring; and $K^-$ represents a non-nucleophilic counter ion.

This way, when the acid generator is the ammonium salt, substances generated by thermal decomposition are amine and an acid. Thus, they are evaporated by heat and unlikely to become a source of particle formation. Therefore, there is little possibility of contaminating the substrate upon forming the pattern, and the substrate with high cleanliness can be obtained.

The present invention also provides a patterning process for patterning a substrate with lithography, wherein at least, a resist lower layer film is formed on the substrate using the resist lower layer film composition, a photoresist film is formed on the resist lower layer film, a pattern circuit area of the photoresist film is exposed and then developed with a developer to form a resist pattern on the photoresist film, and the resist lower layer film and the substrate are etched using the resist pattern as a mask, to form a pattern on the substrate.

This way, an excellent pattern can be formed on the substrate by placing the resist lower layer film formed using the resist lower layer film composition between the substrate and the photoresist film.

The present invention also provides a patterning process for patterning a substrate with lithography, wherein at least, an organic film is formed on a substrate, a silicon-containing film is formed on the organic film, a resist lower layer film is formed on the silicon-containing film using the resist lower layer film composition, a photoresist film is formed on the resist lower layer film, a pattern circuit area of the photoresist film is exposed and then developed with a developer to form a resist pattern on the photoresist film, the resist lower layer film and the silicon-containing film are etched using the resist pattern as the mask, the organic film is etched using the silicon-containing film on which the pattern is formed as a mask, and the substrate is further etched, to form a pattern on the substrate.

This way, a pattern may formed on the substrate by forming the organic film and the silicon-containing film on the substrate and placing the resist lower layer film formed using the resist lower layer film composition between the silicon-containing film and the photoresist film.

As described above, the resist lower layer film composition of the present invention comprises as a base resin at least the polymer having the repeating unit of (meth)acrylic ester represented by the general formula (1) having a hexafluoroalcohol group or a substituent thereof, has fluorine atoms and abundantly comprises oxygen atoms compared with methacrylate usually used. Thus, the etching speed is fast. Therefore, the etching when the resist pattern after the development is transferred to the substrate can be performed in a short time, and the film loss of the upper layer resist film and a deformation of the pattern can be minimized. Accordingly, the resist pattern can be transferred with high accuracy, and an excellent pattern can be formed on the substrate.

DESCRIPTION OF THE INVENTION AND A PREFERRED EMBODIMENT

Embodiments of the present invention will be described below, but the present invention is not limited thereto.

If the etching speed on the resist lower layer film is slow, the etching for transferring the resist pattern after the development to the substrate takes a long time to cause the film loss of the upper layer resist film and the deformation of the pattern. Thus, an excellent pattern can not be formed on the substrate. Therefore, it is necessary that the etching speed on the resist lower layer film is faster than that on the upper layer resist film.

In order to make the etching speed faster, it is important to reduce a carbon density. Thus, the etching speed has been enhanced by changing the base polymer in the antireflection film from the novolak type to the (meth)acryl type and further to the polyester type to increase a ratio of oxygen and decrease a ratio of carbon.

However, it could not be said yet that the etching speed on the conventional resist lower layer film composition was sufficiently fast.

Thus, the present inventors studied extensively to develop the resist lower layer film composition exhibiting the faster etching speed.

In $F_2$ resist, a transparency at a wavelength of 157 nm was enhanced by introducing fluorine, but the reduction of etching resistance has been pointed out. From this, the present inventors thought of that the etching speed could be enhanced by introducing fluorine.

From the above, the present inventors have thought of that when a resist lower layer film composition comprises at least a polymer having (meta)acrylic ester as a repeating unit having a hexafluoroalcohol group or one obtained by substituting its hydroxy group with an acid labile group, a resist lower layer film formed from the resist lower layer film composition has a good adhesiveness to a resist, can produce not a footing profile or a conversely tapered shape but a perpendicular shape of a photoresist pattern after the development, can shorten an etching time period because an etching speed is fast and can inhibit a film thickness loss of the photoresist by the etching, and have completed the present invention.

That is, the resist lower layer film composition of the present invention comprises: at least the polymer having the repeating unit represented by the following general formula (1),

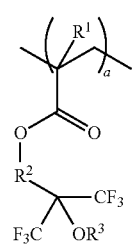

(1)

wherein $R^1$ represents a hydrogen atom or a methyl group; $R^2$ represents a linear or branched alkylene group having 1-8 carbon atoms; $R^3$ represents a hydrogen atom or an acid labile group; and $0 < a \leq 1.0$.

The resist lower layer film composition of the present invention has a feature that the etching speed is fast. This feature is accomplished by making $R^2$ not a cyclic but a linear or branched alkylene group, containing fluorine atoms in the repeating unit a and containing oxygen atoms more abundantly compared with methacrylate usually used.

Since the resist lower layer film composition of the present invention has the fast etching speed, the etching time period for transferring the resist pattern can be shortened and the film loss of the upper layer resist film due to the etching can be inhibited.

Therefore, the resist pattern can be transferred with high accuracy, and an excellent pattern can be formed.

The resist lower layer film composition of the present invention can be used for forming the antireflection film for preventing the halation and the stationary wave in photolithography, and can also be used for forming the resist lower layer film for preventing the occurrence of the footing profile and an undercut of the resist in electron beam exposure.

The method for synthesizing the polymer having the repeating unit represented by the general formula (1) is not particularly limited, and can be performed by standard methods.

The monomer for obtaining the repeating unit a in the general formula (1) is not particularly limited, and is exemplified as follows.

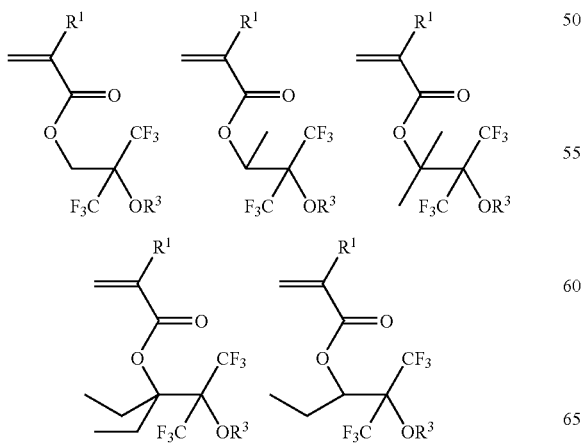

-continued

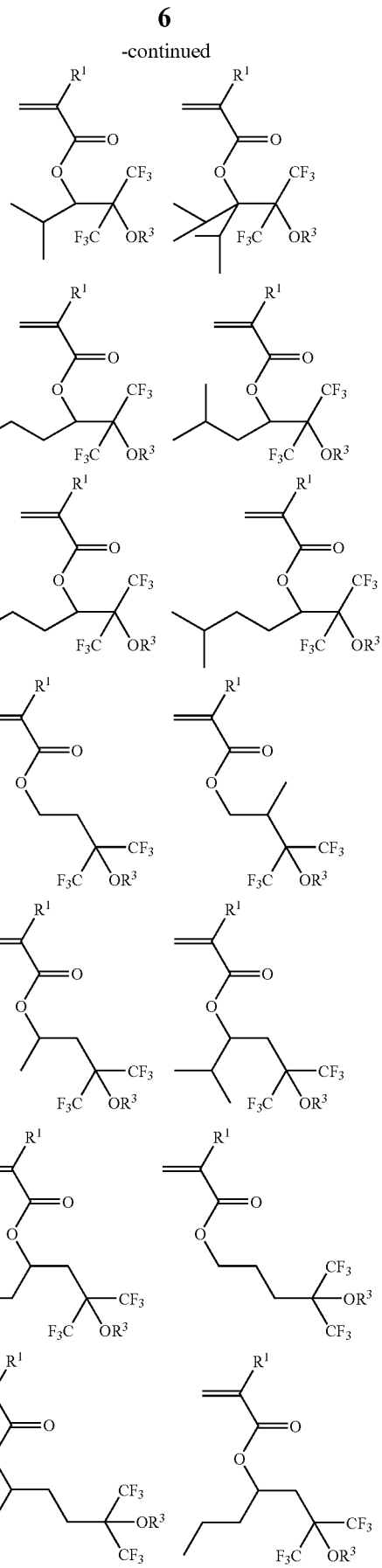

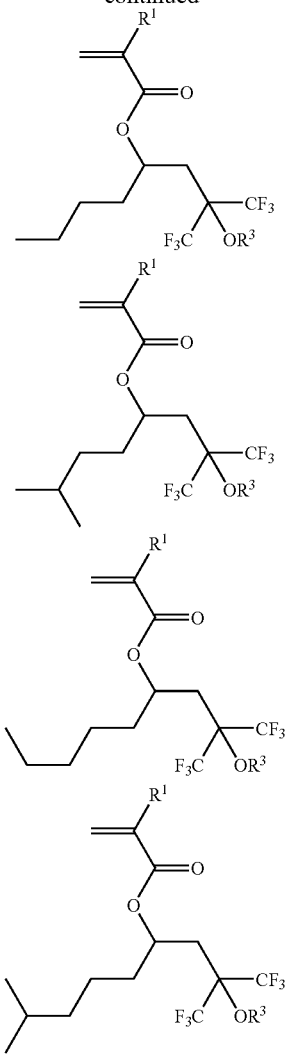

(In the formulae, $R^1$ and $R^3$ are the same as defined above.)

As shown in the general formula (1), the repeating unit a has the hexafluoroalcohol group or the group obtained by substituting its hydroxy group with the acid labile group. By substituting with the acid labile group, a hydrophobicity can be enhanced and the hexafluoroalcohol group can be actively oriented to a surface direction of the film. The acid labile group deprotects by crosslinking with acid to convert into highly hydrophilic hexafluoroalcohol, thereby enhancing the adhesiveness to the resist and preventing the occurrence of blob defect on the antireflection film after the development.

Here, as the acid labile group represented by $R^3$ in the general formula (1), various ones are selected, they may be the same or different, and groups represented by the following formulae (AL-10) and (AL-11), a tertiary alkyl group having 4-40 carbon atoms represented by the following formula (AL-12), an oxoalkyl group having 4-20 carbon atoms, and the like are included.

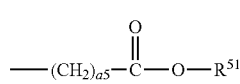

(AL-10)

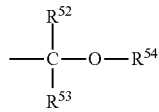

(AL-11)

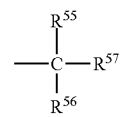

(AL-12)

In the formulae (AL-10) and (AL-11), $R^{51}$ and $R^{54}$ represent a monovalent hydrocarbon group such as a linear, branched or cyclic alkyl group having 1-40, in particular 1-20 carbon atoms, which may contain hetero atom(s), such as oxygen, sulfur, nitrogen, or fluorine. $R^{52}$ and $R^{53}$ represent a hydrogen atom, or a monovalent hydrocarbon group such as a linear, branched or cyclic alkyl group having 1-20 carbon atoms, which may contain hetero atom(s), such as oxygen, sulfur, nitrogen, or fluorine. a5 is an integer of 0 to 10. $R^{52}$ and $R^{53}$, $R^{52}$ and $R^{54}$, or $R^{53}$ and $R^{54}$ may be linked to form a ring having 3-20, in particular 4-16 carbon atoms with the carbon atom to which $R^{52}$ and $R^{53}$ bond or this carbon atom and the oxygen to which $R^{54}$ bonds.

$R^{55}$, $R^{56}$ and $R^{57}$ independently represent a monovalent hydrocarbon group such as a linear, branched or cyclic alkyl group having 1-20 carbon atoms, which may contain hetero atom(s), such as oxygen, sulfur, nitrogen, or fluorine. $R^{55}$ and $R^{56}$, $R^{55}$ and $R^{57}$, or $R^{56}$ and $R^{57}$ may be linked to form a ring having 3-20, in particular 4-16 carbon atoms with the carbon atom to which $R^{55}$, $R^{56}$, and $R^{57}$ bond.

Illustrative examples of the compound represented by the formula (AL-10) may include: tert-butoxy carbonyl group, tert-butoxy carbonyl methyl group, tert-amyloxy carbonyl group, tert-amyloxy carbonyl methyl group, 1-ethoxy ethoxy carbonyl methyl group, 2-tetrahydropyranyl oxy-carbonyl methyl group, 2-tetrahydrofuranyl oxy-carbonyl methyl group, and the like, and further the substituents represented by the following general formulae (AL-10)-1 to (AL-10)-10.

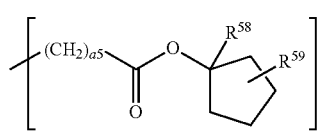

(AL-10)-1

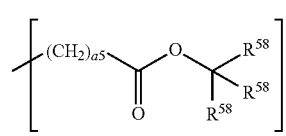

(AL-10)-2

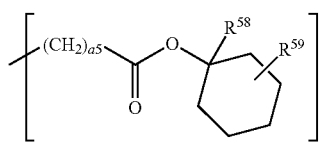

(AL-10)-3

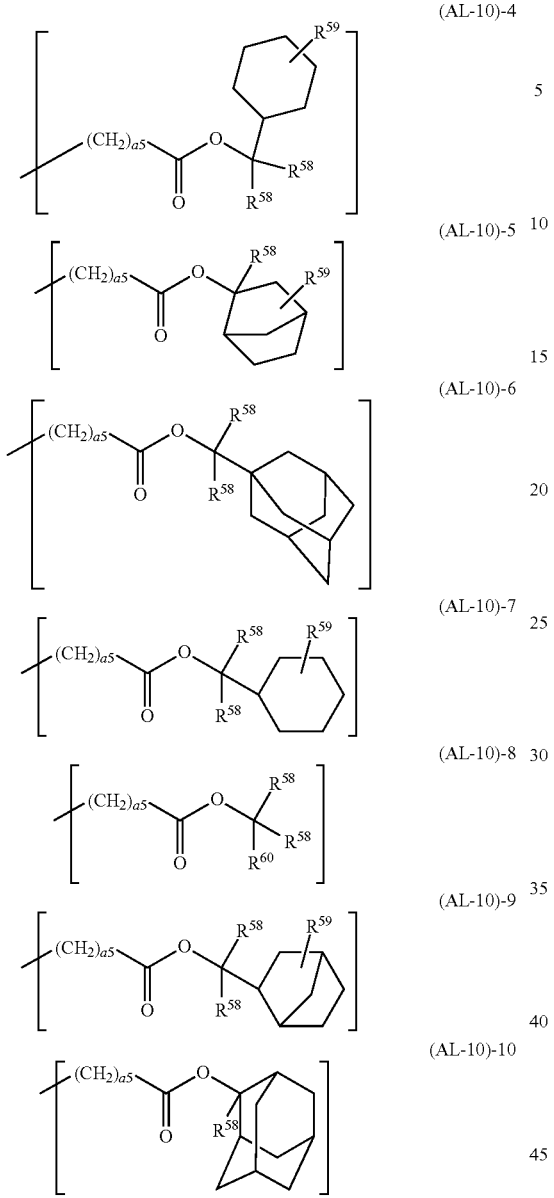

In the formulae (AL-10)-1 to (AL-10)-10, $R^{58}$ may be the same or different, and represents a linear, branched or cyclic alkyl group having 1-8 carbon atoms, an aryl group having 6-20 carbon atoms or an aralkyl group having 7-20 carbon atoms. $R^{59}$ represents a hydrogen atom, or a linear, branched or cyclic alkyl group having 1-20 carbon atoms. $R^{60}$ represents an aryl group having 6-20 carbon atoms or an aralkyl group having 7-20 carbon atoms. a5 represents the same as explained above.

Examples of an acetal compound represented by the formula (AL-11) may include those represented by the formulae (AL-11)-1 to (AL-11)-34.

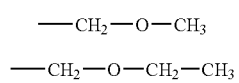

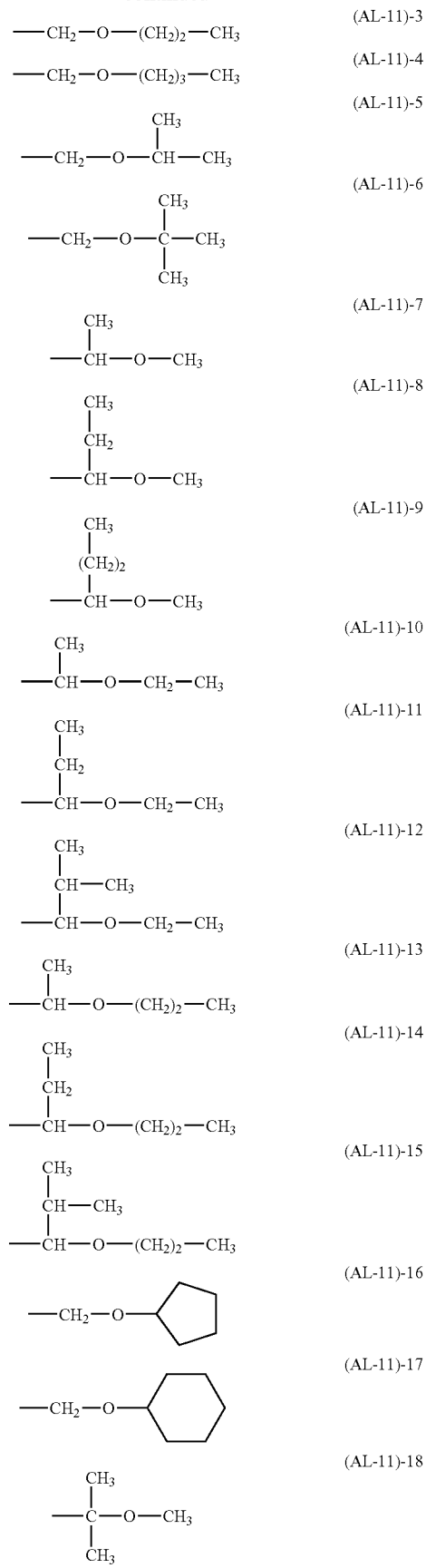

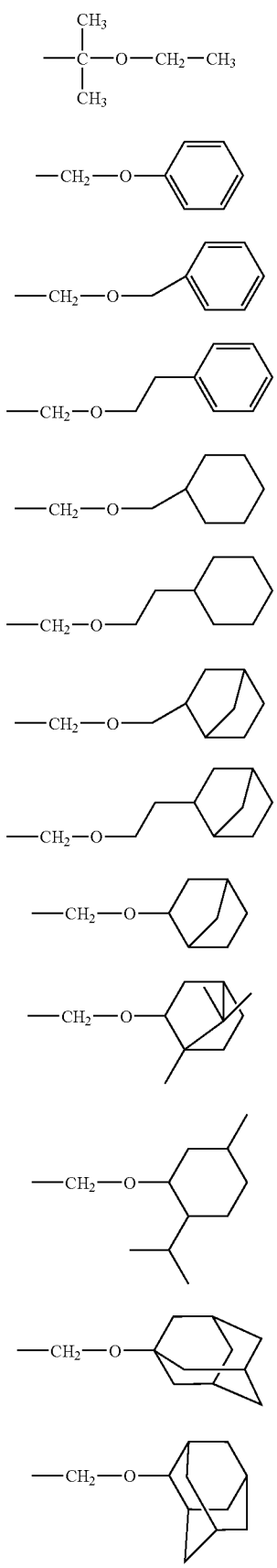

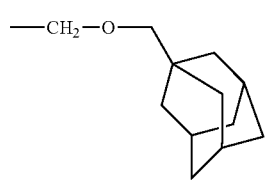

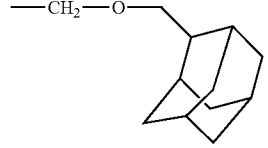

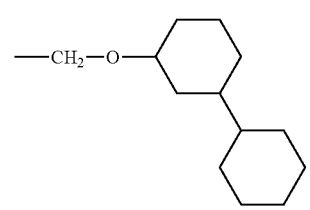

Intermolecular crosslinking or intramolecular crosslinking in the base resin may be performed by the acid labile group represented by the general formula (AL-11a) or (AL-11b).

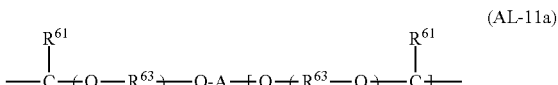

In the above formulae, $R^{61}$ and $R^{62}$ represent a hydrogen atom or a linear, branched or cyclic alkyl group having 1-8 carbon atoms. Alternatively, $R^{61}$ and $R^{62}$ may be linked to form the ring together with the carbon atoms to which $R^{61}$ and $R^{62}$ are bound. When the ring is formed, $R^{61}$ and $R^{62}$ represent a linear or branched alkylene group having 1-8 carbon atoms. $R^{63}$ represents a linear, branched or cyclic alkylene group having 1-10 carbon atoms. b5 and d5 represent an integer of 0 or 1 to 10, preferably 0 or 1 to 5, and c5 represents an integer of 1 to 7. A represents a (c5+1) valent aliphatic or alicyclic hydrocarbon group, an aromatic hydrocarbon group or a heterocyclic group having 1-50 carbon atoms, these group may have hetero atom(s) such as O, S and N, and a part of the hydrogen atom(s) bound to the carbon atom(s) of A may be substituted with a hydroxyl group, a carboxyl group, a carbonyl group or fluorine atoms. B represents —CO—O—, —NHCO—O— or —NHCONH—.

In this case, preferably A represents a bivalent to quadrivalent linear, branched or cyclic alkylene group, alkyltriyl group, alkyltetrayl group having 1-20 carbon atoms, or an arylene group having 6-30 carbon atoms, these groups may have hetero atom(s) such as O, S and N, and a part of the hydrogen atoms bound to the carbon atom thereof may be substituted with a hydroxyl group, a carboxyl group, an acyl group or halogen atoms. Preferably, c5 is an integer of 1 to 3.

Illustrative examples of crosslinking type acetal group shown in the general formula (AL-11a) or (AL-11b) may include those represented by the following formulae (AL-11)-35 to (AL-11)-42.

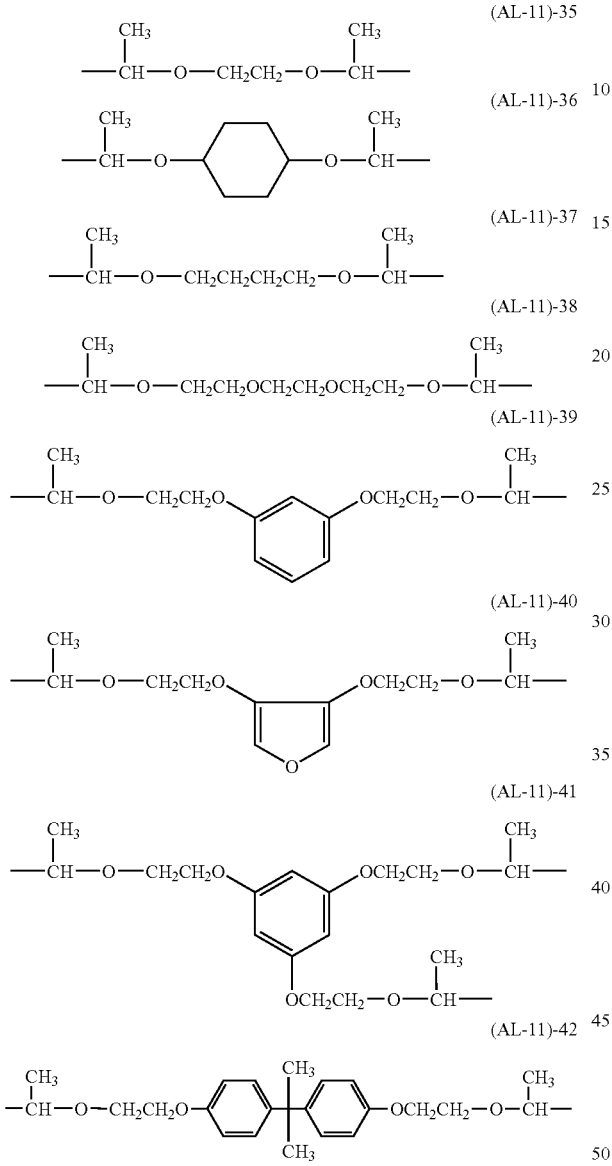

Examples of the tertiary alkyl group shown in the formula (AL-12) may include: tert-butyl group, triethylcarbyl group, 1-ethylnorbornyl group, 1-methylcyclohexyl group, 1-ethyl-cyclopentyl group, tert-amyl group, and the like, or those represented by the following general formulae (AL-12)-1 to (AL-12)-16.

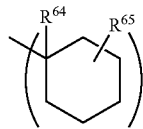

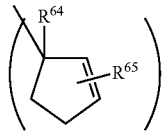

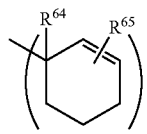

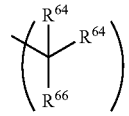

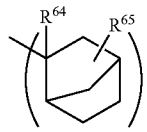

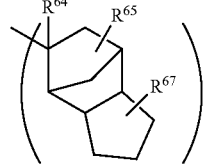

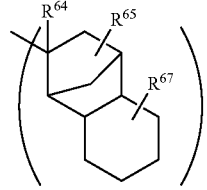

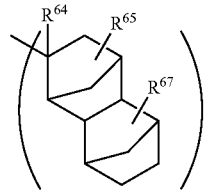

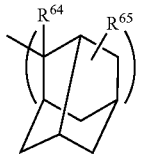

(AL-12)-11
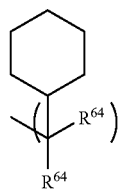

(AL-12)-12
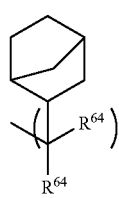

(AL-12)-13
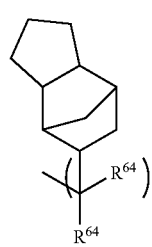

(AL-12)-14
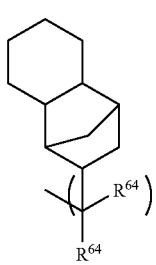

(AL-12)-15
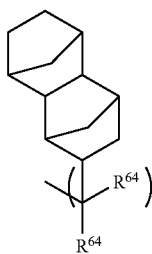

(AL-12)-16
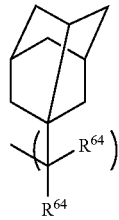

In the formulae, $R^{64}$ may be the same or different, represents a linear, branched or cyclic alkyl group having 1-8 carbon atoms, an aryl group having 6-20 carbon atoms, or an aralkyl group having 7-20 carbon atoms. $R^{65}$ and $R^{67}$ represent a hydrogen atom or a linear, branched or cyclic alkyl group having 1-20 carbon atoms. $R^{66}$ represents an aryl group having 6-20 carbon atoms or an aralkyl group having 7-20 carbon atoms.

Furthermore, as shown in the following formulae (AL-12)-17 and (AL-12)-18, the intramolecular or intermolecular crosslinking may be performed in the polymer by containing $R^{68}$ which is a bivalent or more alkylene group or an arylene group. In the formulae (AL-12)-17 and (AL-12)-18, $R^{64}$ is the same as explained above, $R^{68}$ represents a linear, branched or cyclic alkylene group having 1-20 carbon atoms or an arylene group, and may contain hetero atom(s) such as oxygen, sulfur and nitrogen. b6 is an integer of 1 to 3.

(AL-12)-17
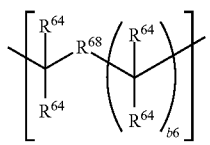

(AL-12)-18
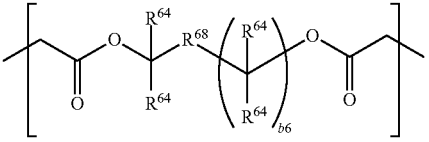

Furthermore, $R^{64}$, $R^{65}$, $R^{66}$ and $R^{67}$ may have the hetero atom(s) such as oxygen, nitrogen, sulfur, and the like, and are specifically represented by the following formulae (AL-13)-1 to (AL-13)-7.

(AL-13)-1

(AL-13)-2
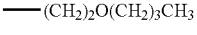

(AL-13)-3

(AL-13)-4
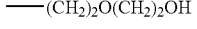

(AL-13)-5

(AL-13)-6
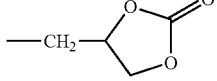

(AL-13)-7
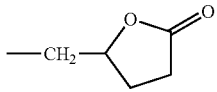

The resist lower layer film composition of the present invention comprises as a base the polymer indispensably having the repeating unit of (meth)acrylic ester having the hexafluoroalcohol group or the group obtained by substituting its hydroxy group with the acid labile group, represented by the general formula (1), and may have a repeating unit b having epoxy, oxetanyl, hydroxy, carboxyl and the like for enhancing a crosslinking efficiency. The monomer for obtaining this repeating unit b can be specifically exemplified as follows.

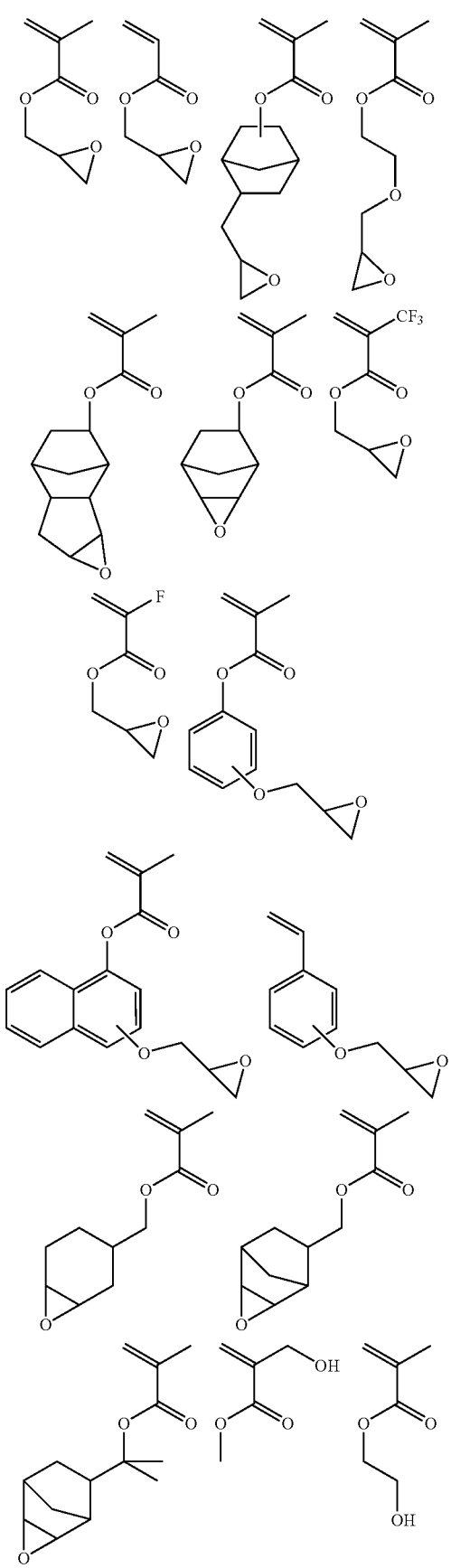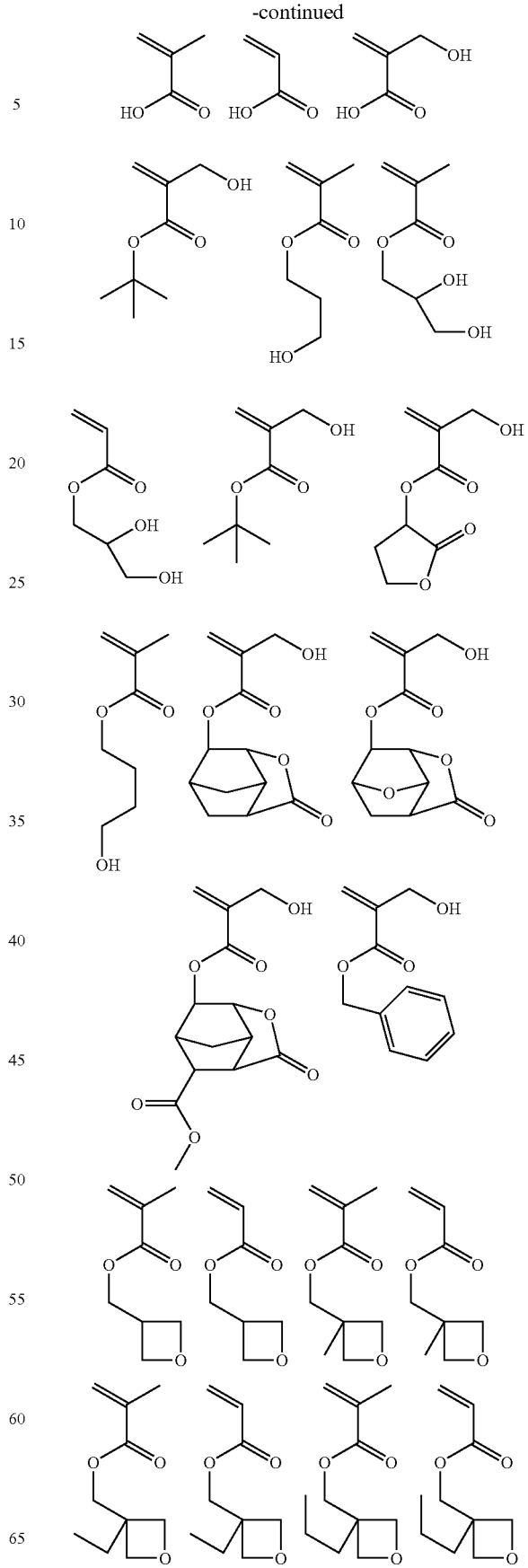
-continued

-continued
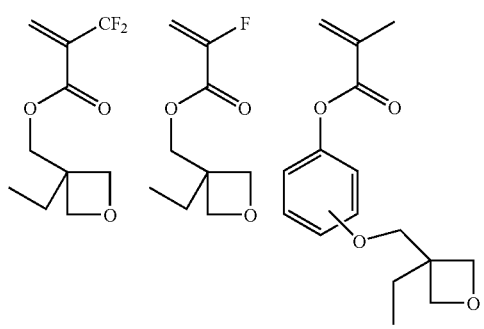
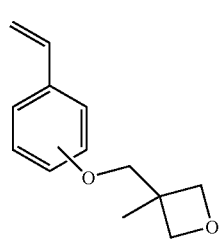
To make the resist lower layer film composition function as the antireflection film, it is preferable that the polymer comprises the repeating unit having the highly light absorbing aromatic group. The monomer for obtaining such a highly light absorbing repeating unit c can be exemplified specifically as follows.
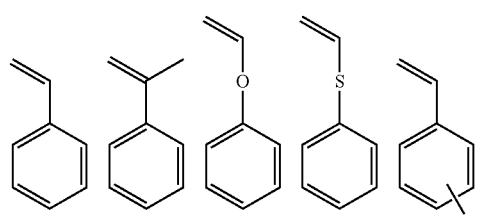
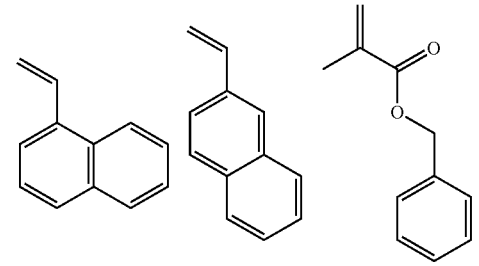
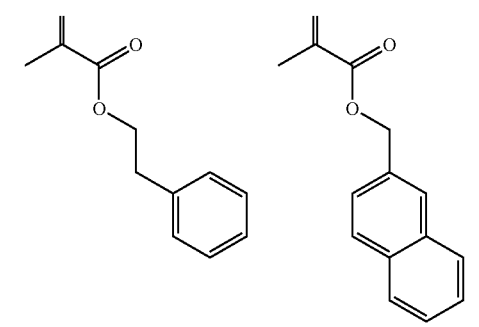
-continued
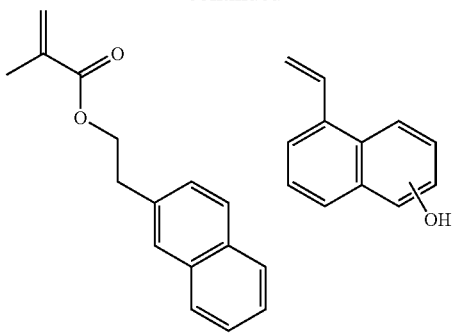
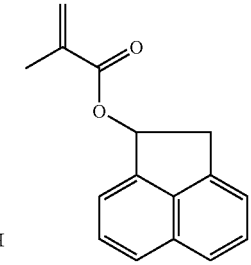
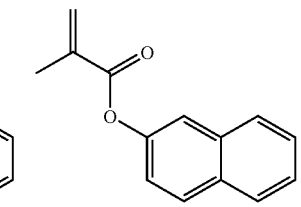

-continued
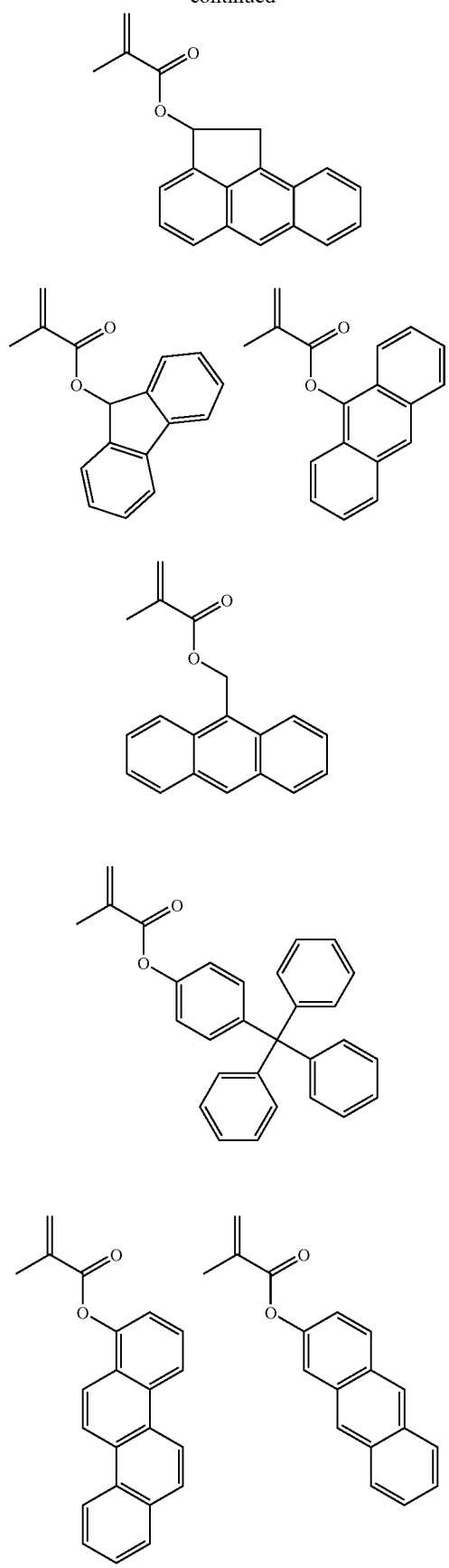
-continued
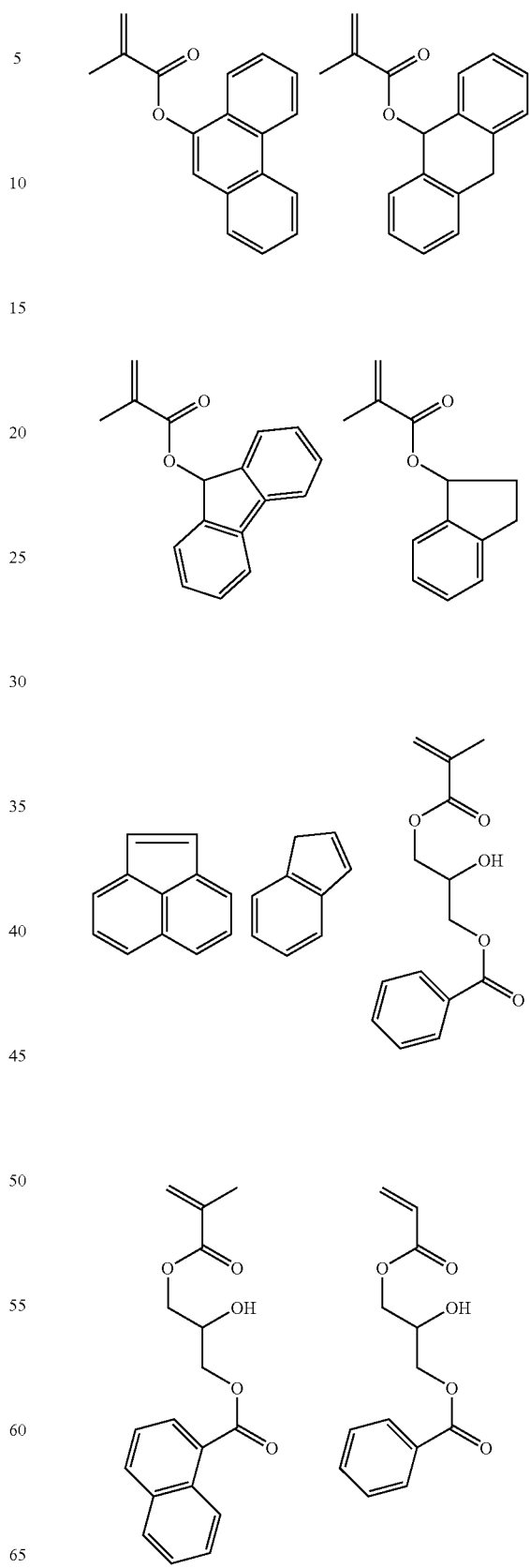

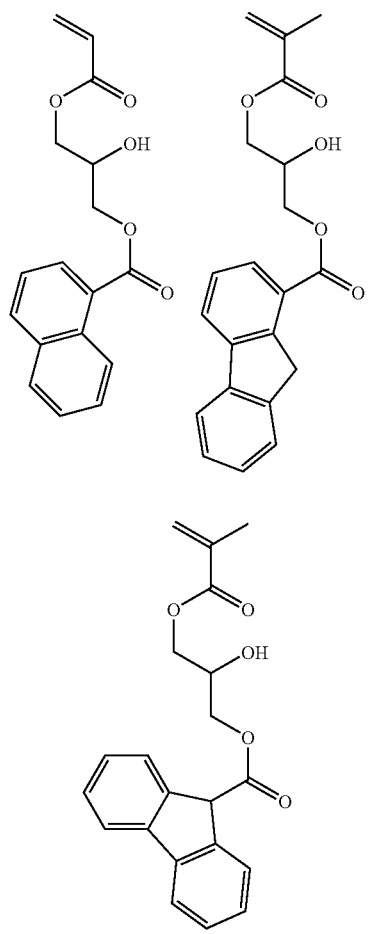

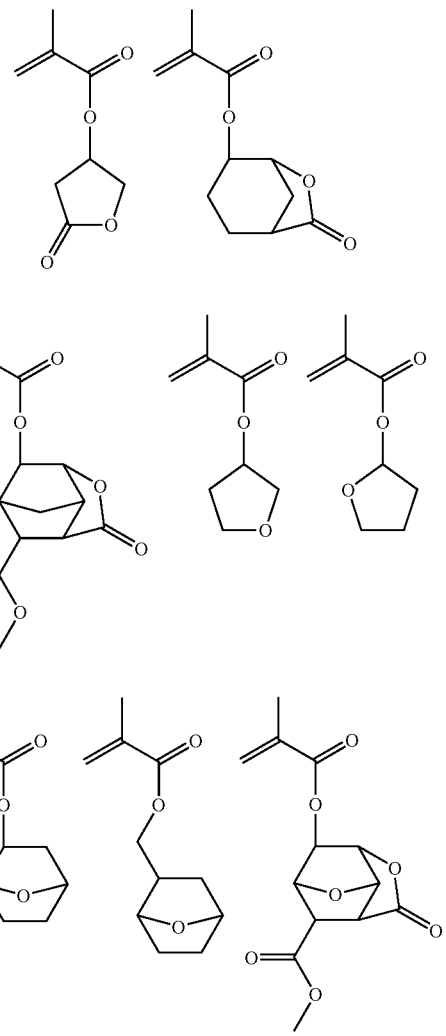

The resist lower layer film composition of the present invention may further have the repeating unit d for enhancing the adhesiveness to the resist and preventing the diffusion and migration of acids and amine from the resist. The monomers for obtaining this repeating unit d are monomers having a hydroxy group, a lactone ring, an ester group, an ether group, a cyano group and an acid anhydrate used as adhesive groups of the resist, and specifically exemplified as follows. Particularly, among the followings, in the case of the repeating unit having 7-oxanorbornane as a partial structure, a 7-oxanorbornane ring is opened by acid and heat to crosslink.

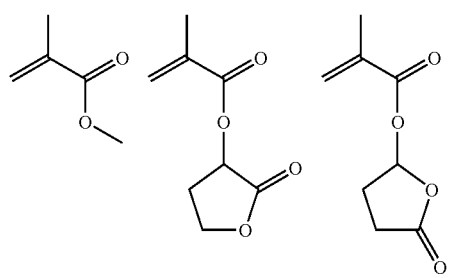

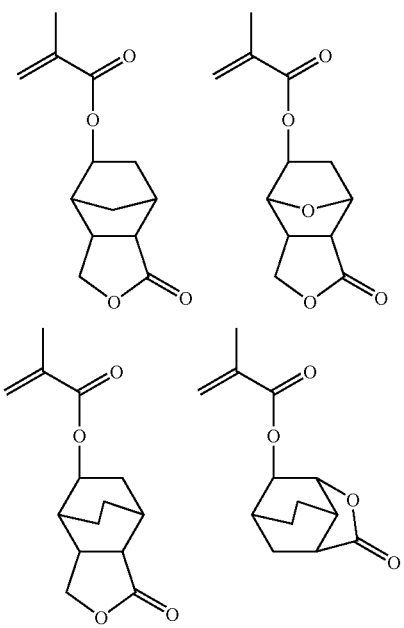

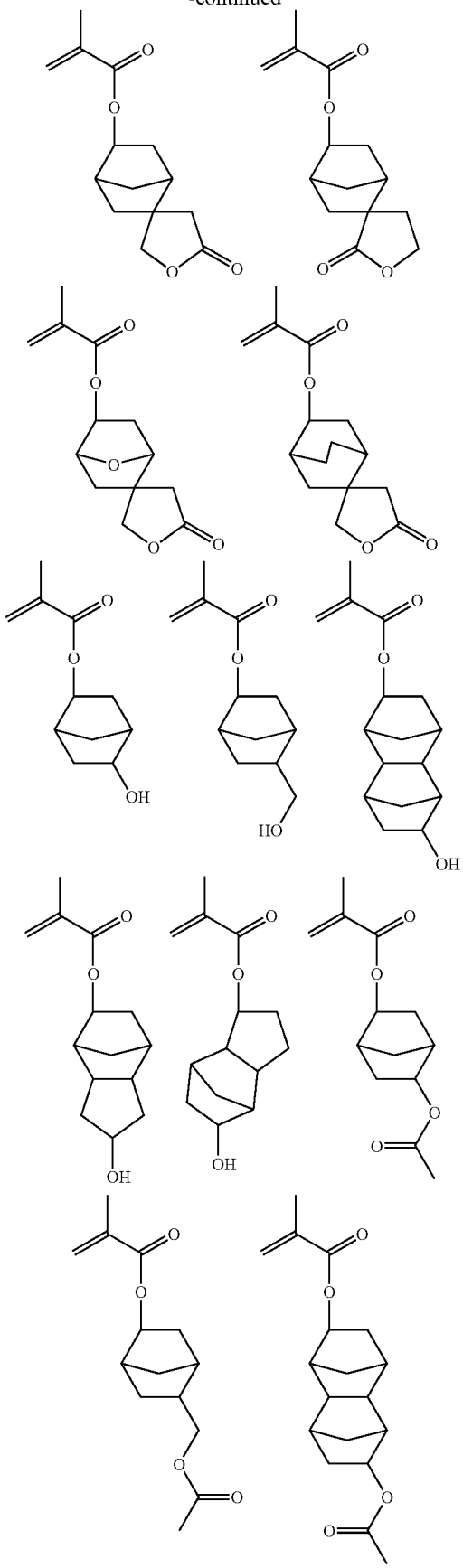
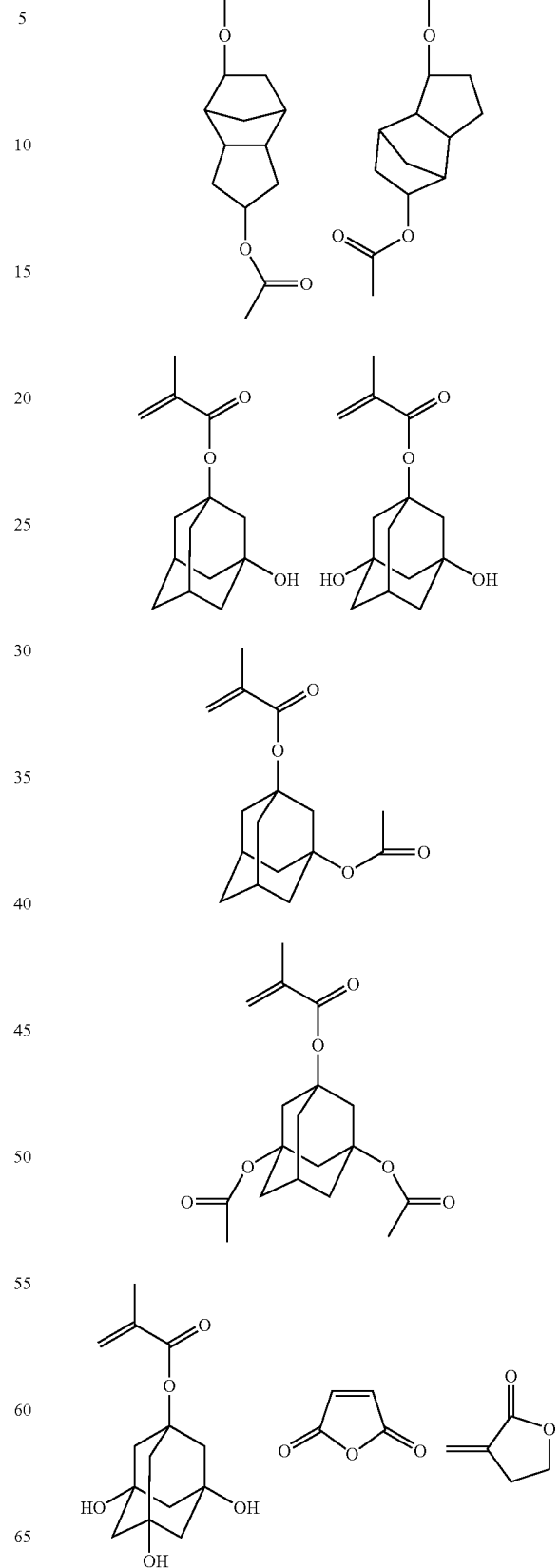

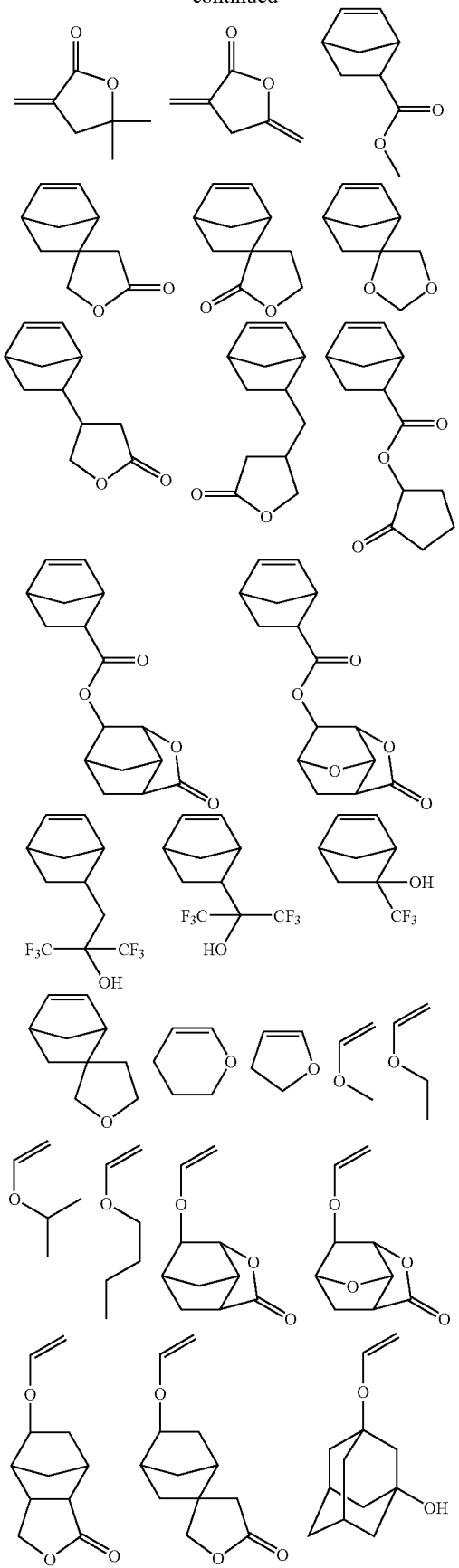
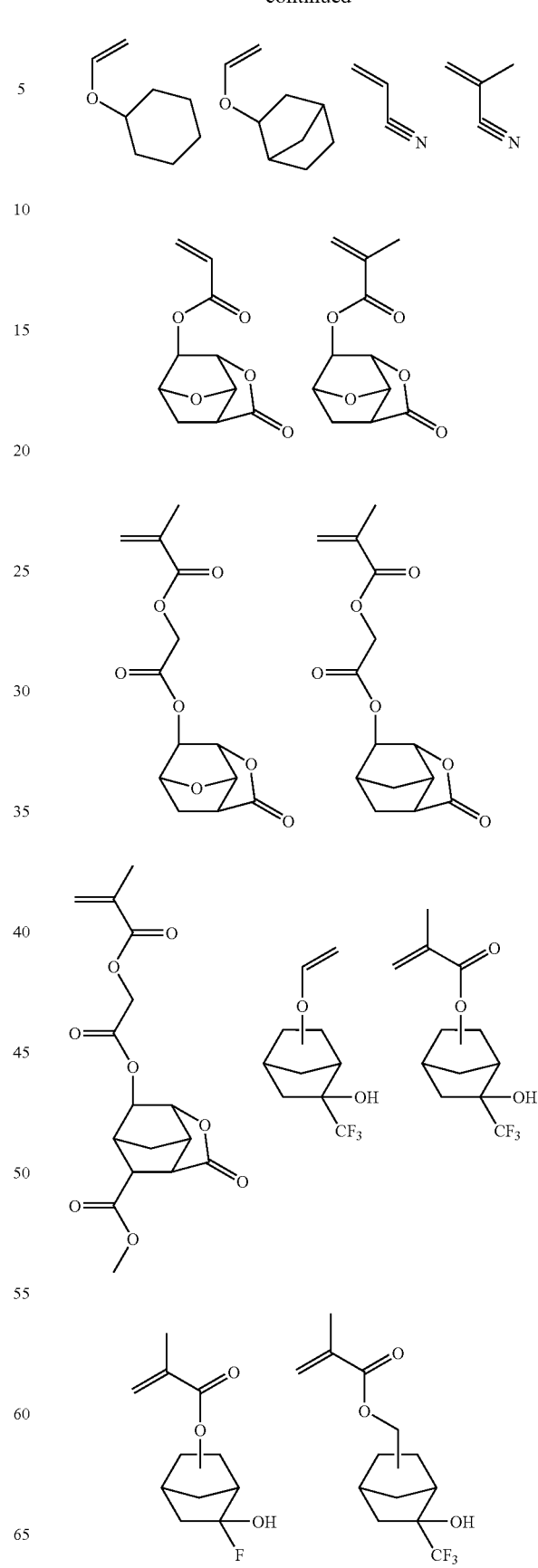

-continued

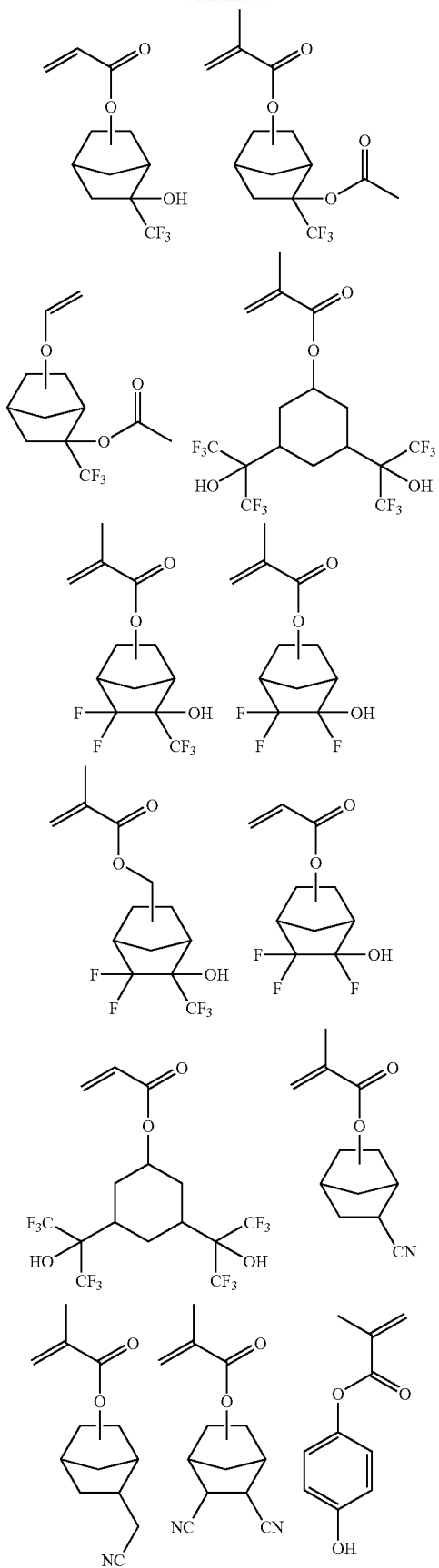

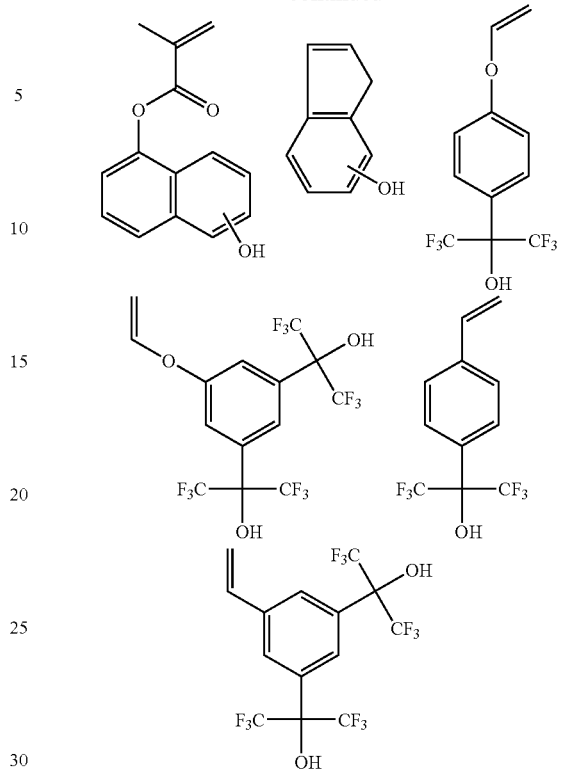

Here, the specific structures of the monomers a to d are as the above, and ratios of copolymerization are 0<a≦1.0, 0≦b≦0.8, 0≦c≦0.8, 0≦d≦0.8, 0.05≦b+c+d≦0.9, more preferably 0.1≦a≦0.9, 0≦b≦0.7, 0≦c≦0.7, 0≦d≦0.7, 0.1≦b+c+d≦0.9, and still more preferably 0.15≦a≦0.8, 0≦b≦0.6, 0≦c≦0.6, 0≦d≦0.6, 0.2≦b+c+d≦0.8.

The formula a+b+c+d=1 is preferable, and indicates that a total amount of the repeating units, a, b, c and d is 100 mole % relative to a total amount of all the repeating units in the polymer (copolymer) containing the repeating units a, b, c and d.

The monomer for obtaining the repeating unit a represented by the general formula (1) is (meth)acrylic ester having the hexafluoroalcohol group or the group obtained by substituting its hydroxy group with the acid labile group. The hydrogen atom in the hydroxy group may have been substituted with an acetyl group, a formyl group, a pivaloyl group, an acetal group, a tertiary alkyl group having 4-16 carbon atoms, or a trimethylsilyl group or the like upon polymerization, and deprotection after the polymerization may make the hydroxy group.

In one method for synthesizing the copolymer contained in the resist lower layer film composition (antireflection film composition) of the present invention, (meth)acrylic ester having the hexafluoroalcohol group and an olefin monomer having the light absorbing group are thermally polymerized in the organic solvent by adding a radical polymerization initiator or a cationic polymerization initiator. A hydroxy group in the monomer containing the hydroxy group has been substituted with an acetyl group, and then alkali hydrolysis of the resulting polymer compound can also be performed in the organic solvent to deprotect the acetyl group. Examples of the organic solvent used in the polymerization may include: toluene, benzene, tetrahydrofuran, diethyl ether, dioxane and the like. Examples of the radical polymerization initiator may include: 2,2'-azobisisobutylonitrile (AIBN), 2,2'-azobis(2,4-dimethylvaleronitrile), dimethyl 2,2-azobis(2-methylpropionate), benzoyl peroxide, lauroyl peroxide and the like. Preferably, the polymerization can be performed by heating at 50 to 80° C. Examples of the cationic polymerization initiator may include: acids such as sulfuric acid, phosphoric acid, hydrochloric acid, nitric acid, hypochlorous acid, trichloroacetic acid, trifluoroacetic acid, methanesulfonic acid, trifluoromethanesulfonic acid, camphor sulfonic acid and tosic acid; Friedel Crafts catalysts such as $BF_3$, $AlCl_3$, $TiCl_4$ and $SnCl_4$; and substances that tend to produce cations such as $I_2$ and $(C_6H_5)_3CCl$.

A reaction time is 2 to 100 hours, and preferably 5 to 20 hours. As a base upon alkali hydrolysis, aqueous ammonia and triethylamine can be used. A reaction temperature is −20 to 100° C. and preferably 0 to 60° C. The reaction time is 0.2 to 100 hours and preferably 0.5 to 20 hours.

A weight average molecular weight of the polymer according to the present invention, obtained by gel permeation chromatography (GPC) in terms of polystyrene is preferably in the range of 1,500 to 200,000 and more preferably 2,000 to 100,000. A molecular weight distribution is not particularly limited, and it is possible to remove low molecular components and high molecular components by fractionation to reduce a dispersion degree. Two or more polymers of the general formula (1) which are different in molecular weight or dispersion degree may be mixed, or two or more polymers of the general formula (1) having different composition ratios may be mixed.

The base resin for the resist lower layer film composition of the present invention is comprises at least the polymer obtained by polymerizing (meth)acrylic ester having the hexafluoroalcohol group or the group obtained by substituting its hydroxy group with the acid labile group, and can be blended with the polymer shown below. For example, to embed a hole without generating voids, the polymer having a low glass transition temperature is used, and the resin is embedded to a bottom of the hole with thermal flow at lower temperature than a crosslinking temperature (e.g., see Japanese patent Lapid-open (Kokai) No. 2000-294504-A). An embedding property of a via hole can be enhanced by lowering the glass transition temperature by blending with the polymer having the low glass transition temperature, particularly the glass transition temperature at 180° C. or below, inter alia, 100 to 170° C., e.g., one or two or more copolymers selected from acryl derivatives, vinyl alcohol, vinyl ethers, allyl ethers, styrene derivatives, allyl benzene derivatives, olefins such as ethylene, propylene and butadiene; the polymer obtained by ring-opening metathesis polymerization, novolak resins, dicyclopentadiene resins, phenolic ballast compounds, cyclodextrins, steroids such as cholic acid, monosaccharides, polysaccharides, calixarenes and fullerenes.

It is preferable that the resist lower layer film composition further contains one or more of an organic solvent, an acid generator and a crosslinking agent.

If the resist lower layer film composition further contains the organic solvent, an application property of the resist lower layer film composition can be further enhanced. If the resist lower layer film composition further contains one or more of the acid generators and the crosslinking agents, a crosslinking reaction in the resist lower layer film can be facilitated by baking after applying on the substrate. Therefore, a dense film can be obtained, there is little possibility of intermixing with the resist upper layer film, and there is few diffusion of low molecular components into the resist upper layer film or the like. As a result, an excellent resist pattern can be obtained, and an excellent pattern can be formed on the substrate.

As the performance required for the resist lower layer film, it is included that there is no intermixing with the resist upper layer film and no diffusion of the low molecular components to the resist upper layer film (e.g., see Proc. SPIE, vol. 2195: 225-229, 1994). To accomplish these performances, generally the resist lower layer film is formed on the substrate by spin-coating, and then thermally crosslinked by baking. Therefor, the method of adding the crosslinking agent as the component of the resist lower layer film composition and the method of introducing the repeating unit having a crosslinkable substituent into the polymer are available.

Specific examples of the addition type crosslinking agent which can be used in the present invention may include: a melamine compound, a guanamine compound, a glycol uryl compound or an urea compound each substituted with at least one group selected from a methylol group, an alkoxy methyl group and an acyloxy methyl group; an epoxy compound, an isocyanate compound, an azide compound, a compound including a double bond such as an alkenyl ether group, and the like. These compounds may be used as an additive, or may be introduced into a polymer side chain as a pendant group. Moreover, a compound containing a hydroxy group may also be used as a crosslinking agent.

Examples of the epoxy compound among the above-mentioned specific examples of the crosslinking agent may include: tris(2,3-epoxypropyl)isocyanurate, trimethylol methanetriglycidyl ether, trimethylol propane triglycidyl ether, triethylol ethanetriglycidyl ether, and the like. Examples of the melamine compound may include: hexamethylol melamine, hexamethoxy methyl melamine, a compound in which 1 to 6 methylol groups of hexamethylol melamine are methoxy methylated or a mixture thereof, hexamethoxy ethyl melamine, hexaacyloxy methyl melamine, a compound in which 1 to 6 methylol groups of hexamethylol melamine are acyloxy methylated or a mixture thereof, and the like. Examples of a guanamine compound may include: tetramethylol guanamine, tetra methoxy methyl guanamine, a compound in which 1 to 4 methylol groups of tetramethylol guanamine are methoxy-methylated and a mixture thereof, tetramethoxy ethyl guanamine, tetraacyloxy guanamine, a compound in which 1 to 4 methylol groups of tetramethylol guanamine are acyloxy-methylated and a mixture thereof, and the like. Examples of a glycol uryl compound may include: tetramethylol glycol uryl, tetramethoxy glycol uryl, tetramethoxy methyl-glycol uryl, a compound in which 1-4 methylol groups of tetramethylol glycol uryl are methoxy methylated or a mixture thereof, and a compound in which 1 to 4 methylol group of tetramethylol glycol uryl are acyloxy methylated or a mixture thereof, and the like. Examples of a urea compound may include: tetra methylol urea, tetra methoxy methyl urea, a compound in which 1 to 4 methylol groups of tetra methylol urea are methoxy-methylated or a mixture thereof, tetra methoxy ethyl urea, and the like.

Examples of the isocyanate compound may include: tolylene diisocyanate, diphenyl methane diisocyanate, hexamethylene diisocyanate, cyclohexane diisocyanate, and the like. Examples of the azide compound may include: 1,1'-biphenyl-4,4'-bisazide, 4,4'-methylidene bisazide, 4,4'-oxybisazide, and the like.

Examples of the compound containing an alkenyl ether group may include: ethylene glycol divinyl ether, triethyleneglycol divinyl ether, 1,2-propanediol divinyl ether, 1,4-butanediol divinyl ether, tetramethylene-glycol divinyl ether, neo pentyl glycol divinyl ether, trimethylol-propane trivinyl ether, hexane diol divinyl ether, 1,4-cyclohexane diol divinyl ether, pentaerythritol trivinyl ether, pentaerythritol tetra vinyl ether, sorbitol tetra vinyl ether, sorbitol penta vinyl ether, trimethylol-propane trivinyl ether, and the like.

When the hydroxy groups in the polymer contained in the resist lower layer film composition of the present invention, e.g., the polymer having the repeating unit represented by the general formula (1) have been partially substituted with a glycidyl group, the addition of the compound comprising the hydroxy group(s) is effective. In particular, the compound comprising two or more hydroxy groups in the molecule is preferable. Examples of the compound containing a hydroxy group or hydroxy groups may include: a compound containing an alcohol group such as naphthol novolak, m- and p-cresol novolak, naphthol dicyclopentadiene novolak, m- and p-cresol dicyclopentadiene novolak, 4,8-bis(hydroxymethyl)tricyclo[5.2.1.0$^{2,6}$]-decane, pentaerythritol, 1,2,6-hexanetriol, 4,4',4''-methylidene tris cyclohexanol, 4,4'-[1-[4-[1-(4-hydroxy cyclohexyl)-1-methylethyl]phenyl]ethylidene] biscyclohexanol, [1,1'-bicyclohexyl]-4,4'-diol, methylene biscyclohexanol, decahydro naphthalene-2,6-diol, [1,1'-bicyclohexyl]-3,3',4,4'-tetrahydroxy and the like; and phenolic ballast compounds such as bisphenol, methylene bisphenol, 2,2'-methylene bis[4-methyl phenol], 4,4'-methylidene-bis[2,6-dimethylphenol], 4,4'-(1-methyl-ethylidene)bis[2-methyl phenol], 4,4'-cyclohexylidene bisphenol, 4,4'-(1,3-dimethyl butylidene)bisphenol, 4,4'-(1-methyl-ethylidene)bis[2,6-dimethyl phenol], 4,4'-oxybisphenol, 4,4'-methylene bisphenol, bis(4-hydroxyphenyl)methanone, 4,4'-methylene bis[2-methylphenol], 4,4'-[1,4-phenylene bis(1-methyl ethylidene)]bisphenol, 4,4'-(1,2-ethane-di-yl)bisphenol, 4,4'-(diethyl silylene)bisphenol, 4,4'-[2,2,2-trifluoro-1-(trifluoromethyl)ethylidene]bisphenol, 4,4',4''-methylidene trisphenol, 4,4'-[1-(4-hydroxyphenyl)-1-methylethyl]phenyl]ethylidene]bisphenol, 2,6-bis[(2-hydroxy-5-methylphenyl)methyl]-4-methyl phenol, 4,4',4''-ethylidyne tris[2-methyl phenol], 4,4',4''-ethylidyne trisphenol, 4,6-bis[(4-hydroxy phenyl)methyl]1,3-benzene diol, 4,4'-[(3,4-dihydroxy phenyl)methylene]bis[2-methylphenol], 4,4',4'',4'''-(1,2-ethanediylidene)tetrakisphenol, 2,2'-methylene bis[6-[(2-hydroxy-5-methylphenyl)methyl]-4-methylphenol], 4,4',4'',4'''-(1,4-phenylene dimethylidyne)tetrakisphenol, 2,4,6-tris(4-hydroxy phenylmethyl)-1,3-benzenediol, 2,4',4''-methylidene trisphenol, 4,4',4'''-(3-methyl-1-propanyl-3-ylidene)trisphenol, 2,6-bis[(4-hydroxy-3-phlorophenyl)methyl]-4-fluorophenol, 2,6-bis[4-hydroxy-3-fluorophenyl] methyl]-4-fluorophenol, 3,6-bis[(3,5-dimethyl-4-hydroxyphenyl)methyl]1,2-benzenediol, 4,6-bis[(3,5-dimethyl-4-hydroxy phenyl)methyl]1,3-benzenediol, p-methylcalix[4]allene, 2,2'-methylene bis[6-[(2,5/3,6-dimethyl-4/2-hydroxyphenyl)methyl]-4-methylphenol, 2,2'-methylene bis[6-[(3,5-dimethyl-4-hydroxyphenyl) methyl]-4-methyl phenol, 4,4',4'',4'''-tetrakis[(1-methyl ethylidene)bis (1,4-cyclohexylidene)]-phenol, 6,6'-methylene bis[4-(4-hydroxy phenyl methyl)-1,2,3-benzentriol, 3,3',5,5'-tetrakis [(5-methyl-2-hydroxyphenyl)methyl]-[(1,1'-biphenyl)-4,4'-diol], and the like.

The amount of the crosslinking agent to be combined in the resist lower layer film composition of the present invention is preferably 5 to 50 parts (parts by mass, the same applies below) and particularly preferably 10 to 40 parts based on 100 parts of the base polymer (total resin content). When the amount is 5 parts or more, there is little possibility of mixing with the resist film. When it is 50 parts or less, there is little possibility of reducing the antireflection effect and causing cracks in the film after crosslinking.

In order to promote crosslinking reactions by heat in the resist lower layer film composition according to the present invention, an acid generator may be further added. As for acid generators, there are acid generators that generate acids upon thermal decomposition and acid generators that generates acids upon photoirradiation. Such a photoacid generator and/or a thermalacid generator may be added.

Examples of an acid generator that may be added to the resist lower layer film composition according to the present invention are as follows:
(i) an onium salt represented by the following general formulae (P1a-1), (P1a-2), (2) or (P1b),
(ii) a diazomethane derivative represented by the following general formula (P2),
(iii) a glyoxime derivative represented by the following general formula (P3),
(iv) a bis sulfone derivative represented by the following general formula (P4),
(v) a sulfonate of an N-hydroxy imide compound represented by the following general formula (P5),
(vi) a β-keto sulfonic-acid derivative,
(vii) a disulfone derivative,
(viii) a nitro benzyl sulfonate derivative, and
(ix) a sulfonate derivative, and the like.

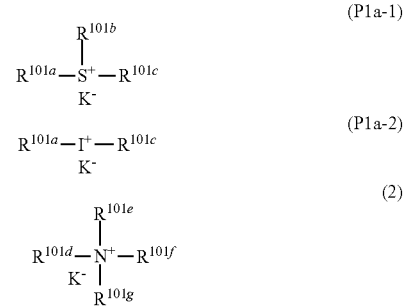

(In the formulae $R^{101a}$, $R^{101b}$, and $R^{101c}$ independently represent a linear, branched or cyclic alkyl group, alkenyl group, oxoalkyl group or oxoalkenyl group each having 1-12 carbon atoms, an aryl group having 6-20 carbon atoms, or an aralkyl group or an aryl oxoalkyl group having 7-12 carbon atoms. Hydrogen atoms in part or in entirety of these groups may be substituted with an alkoxy group or the like. $R^{101b}$ and $R^{101c}$ may form a ring. In the case that they form a ring, $R^{101b}$ and $R^{101c}$ represent an alkylene group having 1-6 carbon atoms respectively. $R^{101d}$, $R^{101e}$, $R^{101f}$ and $R^{101g}$ each represent a hydrogen atom, a linear, branched or cyclic alkyl group, alkenyl group, oxoalkyl group or oxoalkenyl group each having 1-12 carbon atoms, an aryl group having 6-20 carbon atoms, or an aralkyl group or an aryloxoalkyl group each having 7-12 carbon atoms where a part of or all of hydrogen atoms may be substituted with an alkoxy group. $R^{101d}$ and $R^{101e}$, and $R^{101d}$, $R^{101e}$ and $R^{101f}$ can form a ring respectively. When they form a ring, $R^{101d}$ and $R^{101e}$, and $R^{101d}$, $R^{101e}$, and $R^{101f}$, represent an alkylene group having 3-10 carbon atoms or a heteroaromatic ring having the nitrogen atom in the formula in the ring. K$^-$ represents a non-nucleophilic counter ion.)

The $R^{101a}$, $R^{101b}$, $R^{101c}$, $R^{101d}$, $R^{101e}$, $R^{101f}$ and $R^{101g}$ may be the same or different mutually. Examples thereof as an alkyl group may include: a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropyl methyl group, a 4-methyl cyclohexyl group, a cyclohexyl methyl group, a norbornyl group, an adamantyl group, and the like. Examples of an alkenyl group may include: a vinyl group, an allyl group, a propenyl group, a butenyl group, a hexenyl group, a cyclohexenyl group, and the like. Examples of an oxo alkyl group may include: 2-oxocyclopentyl group, 2-oxocyclohexyl group, 2-oxopropyl group, 2-cyclopentyl-2-oxoethyl group, 2-cyclohexyl-2-oxoethyl group, 2-(4-methylcyclohexyl)-2-oxoethyl group, and the like. Examples of an oxo alkenyl group may include: 2-oxo-4-cyclohexenyl group, 2-oxo-4-propenyl group, and the like. Examples of an aryl group may include: a phenyl group, a naphthyl group, and the like; an alkoxy phenyl group such as p-methoxyphenyl group, m-methoxyphenyl group, o-methoxyphenyl group, an ethoxyphenyl group, p-tert-butoxyphenyl group or m-tert-butoxy phenyl group; an alkyl phenyl group such as 2-methylphenyl group, 3-methylphenyl group, 4-methylphenyl group, an ethylphenyl group, 4-tert-butylphenyl group, 4-butylphenyl group, or a dimethyl phenyl group; an alkyl naphthyl group such as a methylnaphthyl group or an ethyl naphthyl group; an alkoxy naphthyl group such as a methoxy naphthyl group or an ethoxy naphthyl group; a dialkyl naphthyl group such as a dimethyl naphthyl group or a diethyl naphthyl group; a dialkoxy naphthyl group such as a dimethoxy naphthyl group or a diethoxy naphthyl group. Examples of an aralkyl group may include a benzyl group, a phenylethyl group, a phenethyl group, and the like. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, and the like.

Examples of a non-nucleophilic counter ion as $K^-$ may include: a halide ion such as a chloride ion or a bromide ion; a fluoro alkyl sulfonate such as triflate, 1,1,1-trifluoro ethanesulfonate, or nonafluoro butane sulfonate; an aryl sulfonate such as tosylate, benzene sulfonate, 4-fluorobenzene sulfonate, or 1,2,3,4,5-pentafluoro benzene sulfonate; and an alkyl sulfonate such as mesylate or butane sulfonate; imidic acid such as bis(trifluoromethyl sulfonyl)imide, bis(perfluoroethyl sulfonyl)imide, or bis(perfluorobutyl sulfonyl)imide; methide acid such as tris(trifluoromethyl sulfonyl)methide, or tris(perfluoroethyl sulfonyl)methide; sulfonates represented by the following general formula (K-1) which are substituted with fluorine atoms at α position; and sulfonates represented by the following general formula (K-2) which are substituted with fluorine atoms at α and β positions.

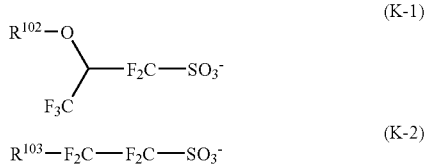

In the general formula (K-1), $R^{102}$ represents a hydrogen atom, a linear, branched or cyclic alkyl group, acyl group each having 1-20 carbon atoms, an alkenyl group having 2-20 carbon atoms, an aryl group having 6-20 carbon atoms, or an aryloxy group.

In the general formula (K-2), $R^{103}$ represents a hydrogen atom, a linear, branched or cyclic alkyl group having 1-20 carbon atoms, an alkenyl group having 2-20 carbon atoms, or an aryl group having 6-20 carbon atoms.

As a non-nucleophilic counter ion represented by $K^-$, a sulfonate substituted with fluorine at α position may be used most preferably because its acid strength is strong and its crosslinking reaction rate is fast.

In addition, examples of a heteroaromatic ring in which $R^{101d}$, $R^{101e}$, $R^{101f}$ and $R^{101g}$ have the nitrogen atom in the formula in the ring may include: an imidazole derivative (for example, imidazole, 4-methyl imidazole, 4-methyl-2-phenyl imidazole, or the like), a pyrazole derivative, a furazan derivative, a pyrroline derivative (for example, pyrroline, 2-methyl-1-pyrroline, or the like), a pyrrolidine derivative (for example, pyrrolidine, N-methyl pyrrolidine, pyrrolidinone, N-methyl pyrolidone, or the like), an imidazoline derivative, an imidazolidine derivative, a pyridine derivative (for example, pyridine, methyl pyridine, ethyl pyridine, propyl pyridine, butyl pyridine, 4-(1-butyl pentyl)pyridine, dimethyl pyridine, trimethyl pyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridone, 4-pyrrolidino pyridine, 1-methyl-4-phenyl pyridine, 2-(1-ethylpropyl)pyridine, amino pyridine, dimethyl amino pyridine, or the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, or the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative, an uridine derivative, and the like.

Although (P1a-1) and (P1a-2) have both effects of a photo acid generator and a thermal acid generator, (2) acts as a thermal acid generator.

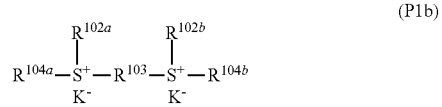

(In the formula, $R^{102a}$, and $R^{102b}$ each represents a linear, branched or cyclic alkyl group having 1-8 carbon atoms. $R^{103}$ represents a linear, branched or cyclic alkylene group having 1-10 carbon atoms. $R^{104a}$ and $R^{104b}$ each represents a 2-oxoalkyl group having 3-7 carbon atoms. $K^-$ represents a non-nucleophilic counter ion.)

Examples of the alkyl group of $R^{102a}$ and $R^{102b}$ may include: a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, 4-methylcyclohexyl group, a cyclohexyl methyl group, and the like.

Examples of the alkylene group of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group, and the like.

Examples of the 2-oxoalkyl group of $R^{104a}$ and $R^{104b}$ may include: 2-oxopropyl group, 2-oxocyclopentyl group, 2-oxocyclohexyl group, 2-oxocycloheptyl group, and the like. Examples of K⁻ may include the same as mentioned in the formulae (P1a-1), (P1a-2) and (2).

Among the onium salts of (P1a-1), (P1a-2), (2) or (P1b), the compounds represented by (P1a-1), (P1a-2) and (P1b) generate acids by light or heat, and the compound represented by (2) generates an acid by heat. Among the onium salts of (P1a-1), (P1a-2), (2) or (P1b), the onium salt of (2) may be used most preferably as the acid generator contained in the resist lower layer film composition of the present invention. The ammonium salt represented by (2) generates the acid and amine by thermal decomposition. Thus they are evaporated by heat, and there is little possibility of becoming a source of particle formation. Therefore, there is little possibility of contaminating the substrate upon forming the pattern, and the substrate with high cleanliness can be obtained.

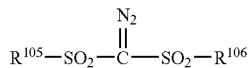
(P2)

(In the formula, $R^{105}$ and $R^{106}$ independently represent a linear, branched or cyclic alkyl group or an alkyl halide group each having 1-12 carbon atoms, an aryl group or an aryl halide group each having 6-20 carbon atoms, or an aralkyl group having 7-12 carbon atoms.)

Examples of an alkyl group as $R^{105}$ and $R^{106}$ may include: a methyl group, an ethyl group, a propyl group, an isopropyl group, a n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group, an adamantyl group, and the like.

Examples of an alkyl halide group as $R^{105}$ and $R^{106}$ may include: trifluoromethyl group, 1,1,1-trifluoroethyl group, 1,1,1-trichloroethyl group, nonafluoro butyl group, and the like.

Examples of an aryl group may include: a phenyl group, an alkoxyphenyl group such as p-methoxyphenyl group, m-methoxyphenyl group, o-methoxyphenyl group, an ethoxyphenyl group, p-tert-butoxyphenyl group, or m-tert-butoxyphenyl group; and an alkylphenyl group such as 2-methylphenyl group, 3-methylphenyl group, 4-methylphenyl group, an ethylphenyl group, 4-tert-butylphenyl group, 4-butylphenyl group, or a dimethylphenyl group.

Examples of an aryl halide group as $R^{105}$ and $R^{106}$ may include: a fluorophenyl group, a chlorophenyl group, 1,2,3,4,5-pentafluoro phenyl group, and the like.

Examples of an aralkyl group as $R^{105}$ and $R^{106}$ may include: a benzyl group, a phenethyl group, and the like.

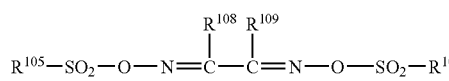
(P3)

(In the formula, $R^{107}$, $R^{108}$ and $R^{109}$ independently represent a linear, branched, cyclic alkyl group or an alkyl halide group each having 1-12 carbon atoms, an aryl group or an aryl halide group each having 6-20 carbon atoms, or an aralkyl group having 7-12 carbon atoms. $R^{108}$ and $R^{109}$ may be bonded to each other and form a cyclic structure. When they form a cyclic structure, $R^{108}$ and $R^{109}$ each independently represents a linear or branched alkylene group having 1-6 carbon atoms. $R^{105}$ is the same as $R^{105}$ in the formula (P2).)

Examples of the alkyl group, the alkyl halide group, the aryl group, the aryl halide group, and the aralkyl group as $R^{107}$, $R^{108}$ and $R^{109}$ may be the same as those explained for $R^{105}$ and $R^{106}$. Examples of an alkylene group for $R^{108}$ and $R^{109}$ may include: a methylene group, an ethylene group, a propylene group, a butylene group, a hexylene group, and the like.

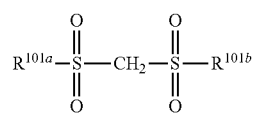
(P4)

(In the formula, $R^{101a}$ and $R^{101b}$ are the same as explained above.)

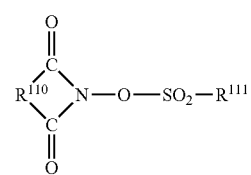
(P5)

(In the formula, $R^{110}$ represents an arylene group having 6-10 carbon atoms, an alkylene group having 1-6 carbon atoms or an alkenylene group having 2-6 carbon atoms. Hydrogen atoms in part or in entirety of these groups may be further substituted with a linear or branched alkyl group or an alkoxy group each having 1-4 carbon atoms, a nitro group, an acetyl group, or a phenyl group. $R^{111}$ represents a linear, branched or substituted alkyl group, alkenyl group or alkoxy alkyl group each having 1-8 carbon atoms, a phenyl group or a naphthyl group. Hydrogen atoms in part or in entirety of these groups may be substituted with an alkyl group or an alkoxy group each having 1-4 carbon atoms; a phenyl group which may be substituted with an alkyl group or an alkoxy group each having 1-4 carbon atoms, a nitro group or an acetyl group; a hetero aromatic group having 3-5 carbon atoms; or a chlorine atom or a fluorine atom.)

Examples of the arylene group as $R^{110}$ may include: 1,2-phenylene group, 1,8-naphtylene group, and the like. Examples of the alkylene group may include: a methylene group, an ethylene group, a trimethylene group, a tetramethylene group, a phenylethylene group, a norbornane-2,3-di-yl group, and the like. Examples of the alkenylene group may include: 1,2-vinylene group, 1-phenyl-1,2-vinylene group, 5-norbornene-2,3-di-yl group, and the like.

Examples of the alkyl group as $R^{111}$ may be the same as those for $R^{101a}$-$R^{101c}$. Examples of the alkenyl group as $R^{111}$ may include: a vinyl group, a 1-propenyl group, an allyl group, a 1-butenyl group, a 3-butenyl group, an isoprenyl group, a 1-pentenyl group, a 3-pentenyl group, a 4-pentenyl group, a dimethyl allyl group, a 1-hexenyl group, a 3-hexenyl group, a 5-hexenyl group, a 1-heptenyl group, a 3-heptenyl group, a 6-heptenyl group, a 7-octenyl group, and the like. Examples of the alkoxy alkyl group may include: a methoxy methyl group, an ethoxy methyl group, a propoxy methyl group, a butoxy methyl group, a pentyloxy methyl group, a hexyloxy methyl group, a heptyloxy methyl group, a methoxy ethyl group, an ethoxy ethyl group, a propoxy ethyl group, a butoxy ethyl group, a pentyloxy ethyl group, a hexyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group, and the like.

Examples of the alkyl group having 1-4 carbon atoms which may be further substituted may include: a methyl group, an ethyl group, a propyl group, an isopropyl group, a n-butyl group, an isobutyl group, a tert-butyl group, and the like. Examples of the alkoxy group having 1-4 carbon atoms may include: a methoxy group, an ethoxy group, a propoxy group, an isopropoxy group, a n-butoxy group, an isobutoxy group, a tert-butoxy group, and the like.

Examples of the phenyl group which may be substituted with an alkyl group, an alkoxy group each having 1-4 carbon atoms, a nitro group or an acetyl group may include: a phenyl group, a tolyl group, a p-tert-butoxy phenyl group, a p-acetyl phenyl group, a p-nitrophenyl group, and the like. Examples of a hetero aromatic group having 3-5 carbon atoms may include: a pyridyl group, a furyl group, and the like.

Examples of the acid generator may include: an onium salt such as tetramethyl ammonium trifluoromethane sulfonate, tetramethyl ammonium nonafluoro butane sulfonate, triethyl ammonium nonafluoro butane sulfonate, pyridinium nonafluoro butane sulfonate, triethyl ammonium camphor sulfonate, pyridinium camphor sulfonate, tetra n-butyl-ammonium nonafluoro butane sulfonate, tetraphenyl ammonium nonafluoro butane sulfonate, tetramethyl ammonium p-toluene sulfonate, diphenyl iodinium trifluoromethane sulfonate, (p-tert-butoxy phenyl)phenyl iodinium trifluoromethane sulfonate, diphenyl iodinium p-toluene sulfonate, (p-tert-butoxy phenyl)phenyl iodinium p-toluene sulfonate, triphenyl sulfonium trifluoromethane sulfonate, (p-tert-butoxy phenyl) diphenyl sulfonium trifluoromethane sulfonate, bis(p-tert-butoxy phenyl)phenyl sulfonium trifluoromethane sulfonate, tris(p-tert-butoxy phenyl)sulfonium trifluoromethane sulfonate, triphenyl sulfonium p-toluene sulfonate, (p-tert-butoxy phenyl)diphenyl sulfonium p-toluene sulfonate, bis(p-tert-butoxy phenyl)phenyl sulfonium p-toluene sulfonate, tris (p-tert-butoxy phenyl)sulfonium p-toluene sulfonate, triphenyl sulfonium nonafluoro butane sulfonate, triphenyl sulfonium butane sulfonate, trimethyl sulfonium trifluoromethane sulfonate, trimethyl sulfonium p-toluene sulfonate, cyclohexyl methyl(2-oxocyclohexyl)sulfonium trifluoromethane sulfonate, cyclohexyl methyl(2-oxo cyclohexyl)sulfonium p-toluene sulfonate, dimethyl phenyl sulfonium trifluoromethane sulfonate, dimethyl phenyl sulfonium p-toluene sulfonate, dicyclohexyl phenyl sulfonium trifluoromethane sulfonate, dicyclohexyl phenyl sulfonium p-toluene sulfonate, trinaphthylsulfonium trifluoromethane sulfonate, (2-norbonyl)methyl(2-oxocyclohexyl)sulfonium trifluoromethane sulfonate, ethylene bis[methyl(2-oxocyclopentyl)sulfonium trifluoromethane sulfonate], 1,2'-naphthyl carbonyl methyl-tetrahydro thiophenium triflate, triethyl ammonium nonaflate, tributyl ammonium nonaflate, tetraethyl ammonium nonaflate, tetrabutyl ammonium nonaflate, triethyl ammonium bis(trifluoromethylsulfonyl)imide, triethyl ammonium tris(perfluoroethylsulfonyl)methide, and the like.

Examples of a diazomethane derivative may include: bis (benzene sulfonyl)diazomethane, bis(p-toluene sulfonyl)diazomethane, bis(xylene sulfonyl)diazomethane, bis(cyclohexyl sulfonyl)diazomethane, bis(cyclopentyl sulfonyl) diazomethane, bis(n-butylsulfonyl)diazomethane, bis (isobutyl sulfonyl)diazomethane, bis(sec-butylsulfonyl) diazomethane, bis(n-propylsulfonyl)diazomethane, bis (isopropyl sulfonyl)diazomethane, bis(tert-butyl-sulfonyl) diazomethane, bis(n-amylsulfonyl)diazomethane, bis (isoamylsulfonyl)diazomethane, bis(sec-amylsulfonyl) diazomethane, bis(tert-amylsulfonyl)diazomethane, 1-cyclohexylsulfonyl-1-(tert-butyl-sulfonyl)diazomethane, 1-cyclohexyl sulfonyl-1-(tert-amyl sulfonyl)diazomethane, 1-tert-amyl sulfonyl-1-(tert-butyl-sulfonyl)diazomethane, and the like.

Examples of a glyoxime derivative may include: bis-O-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-methyl-3,4-pentanedione glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethylglyoxime, bis-O-(trifluoromethane sulfonyl)-α-dimethylglyoxime, bis-O-(1,1,1-trifluoro ethane sulfonyl)-α-dimethylglyoxime, bis-O-(tert-butane sulfonyl)-α-dimethylglyoxime, bis-O-(perfluoro octane sulfonyl)-α-dimethylglyoxime, bis-O-(cyclohexane sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-tert-butylbenzene sulfonyl)-α-dimethylglyoxime, bis-O-(xylene sulfonyl)-α-dimethylglyoxime, bis-O-(camphor sulfonyl)-α-dimethylglyoxime, and the like.

Examples of a bissulfone derivative may include: bis naphthyl sulfonyl methane, bis-trifluoro methyl sulfonyl methane, bis methyl sulfonyl methane, bis ethyl sulfonyl methane, bis propyl sulfonyl methane, bis isopropyl sulfonyl methane, bis-p-toluene sulfonyl methane, bis benzene sulfonyl methane, and the like.

Examples of the β-ketosulfone derivative may include: 2-cyclohexyl carbonyl-2-(p-toluene sulfonyl) propane, 2-isopropyl carbonyl-2-(p-toluene sulfonyl) propane, and the like.

Examples of the disulfone derivative may include: a diphenyl disulfone derivative, a dicyclohexyl disulfone derivative, and the like.

Examples of the nitro benzyl sulfonate derivative may include: 2,6-dinitro benzyl p-toluenesulfonate, 2,4-dinitro benzyl p-toluenesulfonate, and the like.

Examples of the sulfonate derivative may include: 1,2,3-tris(methane sulfonyloxy)benzene, 1,2,3-tris(trifluoromethane sulfonyloxy)benzene, 1,2,3-tris(p-toluene sulfonyloxy)benzene, and the like.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzenesulfonate, N-hydroxy succinimide-2,4,6-trimethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene-2,3-dicarboxyimide methane sulfonate, N-hydroxy-5-norbornene-2,3-dicarboxyimide trifluoromethane sulfonate, N-hydroxy-5-norbornene-2,3-dicarboxyimide p-toluenesulfonate, and the like.

In particular, preferred examples of acid generators may include: an onium salt such as triphenyl sulfonium trifluoromethane sulfonate, (p-tert-butoxy phenyl)diphenyl sulfonium trifluoromethane sulfonate, tris(p-tert-butoxy phenyl)sulfonium trifluoromethane sulfonate, triphenyl sulfonium p-toluene sulfonate, (p-tert-butoxy phenyl)diphenyl sulfonium p-toluene sulfonate, tris(p-tert-butoxy phenyl)sulfonium p-toluene sulfonate, trinaphthylsulfonium trifluoromethane sulfonate, cyclohexyl methyl(2-oxocyclohexyl)sulfonium trifluoromethane sulfonate, (2-norbonyl)methyl(2-oxocyclohexyl)sulfonium trifluoromethane sulfonate, 1,2'-naphthyl carbonylmethyl tetrahydrothiophenium triflate, and the like;

a diazomethane derivative such as bis(benzene sulfonyl)diazomethane, bis(p-toluene sulfonyl)diazomethane, bis(cyclohexyl sulfonyl)diazomethane, bis(n-butylsulfonyl)diazomethane, bis(isobutyl sulfonyl)diazomethane, bis(sec-butylsulfonyl)diazomethane, bis(n-propyl sulfonyl)diazomethane, bis(isopropyl sulfonyl)diazomethane, bis(tert-butylsulfonyl)diazomethane, and the like;

a glyoxime derivative, such as bis-O-(p-toluene sulfonyl)-α-dimethylglyoxime, bis-O-(n-butane sulfonyl)-α-dimethylglyoxime, and the like;

a bissulfone derivative, such as bisnaphthyl sulfonyl methane;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succininide p-toluene sulfonate, N-hydroxy naphthalimide methane sulfonate, N-hydroxy naphthalimide benzenesulfonate, and the like.

It should be noted that the acid generators mentioned above may be used alone or in admixture.

The amount of the acid generator to be added is preferably 0.1 to 50 parts, more preferably 0.5 to 40 parts to 100 parts of the base polymer. When the amount is 0.1 parts or more, there is less possibility that an amount of an acid generated is insufficient and sufficient crosslinking reactions do not occur. When the amount is 50 parts or less, there is less possibility that a mixing phenomenon occurs due to mingration of acids to an overlying resist.

Furthermore, a basic compound for improving storage stability may be further added to the resist lower layer film composition according to the present invention. The basic compound functions as a quencher that prevents an acid generated in small amounts during storage or the like from inducing crosslinking reactions.

Examples of such a basic compound may include: primary, secondary and tertiary aliphatic amines, mixed amines, aromatic amines, heterocyclic amines, nitrogen-containing qcompounds having a carboxy group, nitrogen-containing compounds having a sulfonyl group, nitrogen-containing compounds having a hydroxyl group, nitrogen-containing compounds having a hydroxy phenyl group, nitrogen-containing alcohol compounds, amide derivatives, imide derivatives and the like.

Examples of the primary aliphatic amines may include: ammonia, methylamine, ethylamine, n-propylamine, isopropylamine, n-butylamine, isobutyl amine, sec-butyl-amine, tert-butylamine, pentylamine, tert-amylamine, cyclopentyl amine, hexylamine, cyclohexyl amine, heptylamine, octylamine, nonylamine, decyl amine, dodecylamine, cetylamine, methylene diamine, ethylenediamine, tetraethylene pentamine and the like. Examples of the secondary aliphatic amines may include: dimethylamine, diethylamine, di-n-propylamine, diisopropyl amine, di-n-butylamine, diisobutyl amine, di-sec-butylamine, dipentylamine, dicyclopentyl amine, dihexyl amine, dicyclohexyl amine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine and the like. Examples of the tertiary aliphatic amines may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N,N',N'-tetra methyl methylene diamine, N,N,N',N'-tetramethyl ethylenediamine, N,N,N',N'-tetramethyl tetraethylene pentamine and the like.

Moreover, examples of the mixed amines may include: a dimethyl ethylamine, methyl ethyl propyl amine, benzylamine, phenethyl amine, benzyl dimethylamine, and the like.

Examples of the aromatic amines and the heterocyclic amines may include: an aniline derivative (for example, aniline, N-methyl aniline, N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine, and the like), diphenyl(p-tolyl)amine, methyl diphenylamine, triphenylamine, phenylenediamine, naphthylamine, diamino naphthalene, a pyrrole derivative (for example, pyrrole, 2H-pyrrole, 1-methyl pyrrole, 2,4-dimethyl pyrrole, 2,5-dimethyl pyrrole, N-methyl pyrrole, and the like), an oxazole derivative (for example, oxazole, isoxazole and the like), a thiazole derivative (for example, thiazole, isothiazole, and the like), an imidazole derivative (for example, imidazole, 4-methyl imidazole, 4-methyl-2-phenyl imidazole and the like), a pyrazole derivative, a furazan derivative, a pyrroline derivative (for example, pyrroline, 2-methyl-1-pyrroline and the like), a pyrrolidine derivative (for example, pyrrolidine, N-methyl pyrrolidine, pyrrolidinone, N-methyl pyrolidone and the like), an imidazoline derivative, an imidazolidine derivative, a pyridine derivative (for example, pyridine, methyl pyridine, ethyl pyridine, propyl pyridine, butyl pyridine, 4-(1-butyl pentyl)pyridine, dimethyl pyridine, trimethyl pyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridine, 4-pyrrolidino pyridine, 1-methyl-4-phenylpyridine, 2-(1-ethylpropyl)pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, an uridine derivative and the like.

Furthermore, examples of the nitrogen-containing compounds having a carboxy group may include: aminobenzoic acid, indole carboxylic acid, and an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, or methoxy alanine) and the like. Examples of the nitrogen-containing compounds having a sulfonyl group may include: 3-pyridine sulfonic acid, pyridinium p-toluene sulfonate and the like. Examples of the nitrogen-containing compounds having a hydroxyl group, the nitrogen-containing compounds having a hydroxy phenyl group, and the nitrogen-containing alcohol compounds may include: 2-hydroxy, pyridine, amino cresol, 2,4-quinoline diol, 3-indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl) pyridine, 1-(2-hydroxyethyl)piperazine, 1-(2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidino-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl)phthalimide, N-(2-hydroxyethyl) isonicotinamide, and the like.

Examples of the amide derivatives may include: formamide, N-methyl formamide, N,N-dimethylfor amide, acetamide, N-methyl acetamide, N,N-dimethylacetamide, propione amide, benzamide, and the like.

Examples of the imide derivatives may include: phthalimide, succininide, maleimide, and the like.

The amount of addition of the basic compound is preferably 0.001 to 2 parts, and in particular, 0.01 to 1 part to 100 parts of all the base polymers. When the amount is 0.001 parts or more, sufficient effects of adding the compound are obtained. When the amount is 2 parts or less, there is less possibility that the compound traps all acids generated by heat and thus no crosslinking reactions occur.

As the organic solvent that may be added to the resist lower layer film composition according to the present invention, any organic solvent that dissolves the base polymer, an acid generator, a crosslinker and other additives may be used. Examples of such an organic solvent may include: ketones such as cyclohexanone, methyl-2-amyl ketone; alcohols such as 3-methoxy butanol, 3-methyl-3-methoxy butanol, 1-methoxy-2-propanol, 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, or diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono methyl ether acetate, or propylene glycol mono tert-butyl ether acetate. Above solvents may be used alone or in admixture. However, the organic solvent that may be added to the resist lower layer film composition according to the present invention is not restricted to the above solvents. In the antireflection film composition according to the present invention, among the organic solvents, diethylene glycol dimethyl ether, 1-ethoxy-2-propanol, ethyl lactate, propylene glycol monomethyl ether acetate, or a mixture thereof are preferably used.

The amount of the organic solvent to be added is preferably 200 to 10,000 parts, and more preferably 300 to 5,000 parts to 100 parts of all the base polymers.

The present invention provides the patterning process for patterning a substrate with lithography, wherein at least, a resist lower layer film is formed on the substrate using the resist lower layer film composition, a photoresist film is formed on the resist lower layer film, a pattern circuit area of the photoresist film is exposed, subsequently developed with the developer to form a resist pattern on the photoresist film, the resist lower layer film and the substrate are etched using the resist pattern as a mask to form a pattern on the substrate.

Furthermore the present invention provides the patterning process for patterning a substrate with lithography, wherein at least, an organic film is formed on the substrate, a silicon-containing film is formed on the organic film, a resist lower layer film is formed on the silicon-containing film using the resist lower layer film composition, a photoresist film is formed on the resist lower layer film, a pattern circuit area of the photoresist film is exposed, subsequently developed with the developer to form a resist pattern on the photoresist film, the resist lower layer film and the silicon-containing film are etched using the resist pattern as the mask, the organic film is etched using the silicon-containing film on which the pattern has been formed as the mask, and the substrate is further etched to form a pattern on the substrate.

Si, $SiO_2$, SiON, SiN, p-Si, $\alpha$-Si, W, W—Si, Al, Cu and Al—Si which become the substrate to be processed, and various low dielectric films and etching stopper films thereof are used for an under layer of the resist lower layer of the present invention, and can be formed into films having the film thickness of typically 10 to 10,000 nm and particularly 20 to 5,000 nm.

Also on the substrate to be processed, a hard mask may be placed for processing the substrate to be processed, and as the hard mask, SiN, SION, p-Si, p-Si, $\alpha$-Si, W, W—Si and the like are used when the substrate to be processed is an $SiO_2$-based insulation film substrate. When the substrate to be processed is a gate electrode of p-Si, W—Si or Al—Si, $SiO_2$, SiN and SiON are used.

In this case, the resist lower layer film can be formed on the hard mask using the resist lower layer film composition of the present invention.

Also, the organic film may be formed on the substrate to be processed, and the silicon-containing film may be formed on the organic film. In this case, the resist lower layer film can be formed on the silicon-containing film using the resist lower layer film composition of the present invention. Furthermore, the photoresist film can be formed on the resist lower layer film, the pattern circuit area of the photoresist film is exposed, subsequently developed with the developer to form the resist pattern on the photoresist film, the resist lower layer film and the silicon-containing film are etched using the resist pattern as a mask, the organic film is etched using the silicon-containing film on which the pattern has been formed as a mask, and the substrate can be further etched to form a pattern on the substrate.

Subsequently, the method for forming the resist lower layer film of the present invention will be described. It is possible to form the resist lower layer film on the substrate by spin-coating method in the same way as in the ordinary method for forming the photoresist films. After forming the resist lower layer film by the spin-coating method, it is desirable to bake for facilitating the crosslinking reaction in order to evaporate the organic solvent and prevent the mixing with the resist upper layer. A baking temperature is preferably in the range of 80 to 300° C. for 10 to 300 seconds. The thickness of the resist lower layer film is appropriately selected, and is 10 to 200 nm and particularly preferably 20 to 150 nm. The film thickness exhibiting the high antireflection effect can be selected when the resist lower layer film is used as the antireflection film. The resist lower layer film is formed, and subsequently the resist upper layer film is formed thereon in this way.

In this case, the base polymer composed of hydrocarbon known publicly as shown in Japanese patent Lapid-open (Kokai) No. 9-73173-A and Japanese patent Lapid-open (Kokai) No. 2000-336121-A can be used as a photoresist composition for forming this resist upper layer film.

The thickness of the resist upper layer film is not particularly limited, and is preferably 30 to 500 nm and particularly preferably 50 to 400 nm.

When the resist upper layer film is formed using the photoresist composition, the spin-coating method is preferably used as is the case with forming the resist lower layer film. After forming the resist upper layer film by the spin-coating method, pre-baking is performed preferably at 80 to 180° C. for 10 to 300 seconds.

Subsequently, according to the standard methods, the pattern circuit area of the resist film is exposed, and post-exposure baking (PEB) and the development are performed to give the resist pattern.

A resist overcoat can also be applied onto the upper layer of the resist film. The resist overcoat can have the antireflection function, and water-soluble and water-insoluble materials are available therefor. As the water-insoluble material, those soluble in the alkali developer and those insoluble in the alkali developer and detached by a fluorine based solvent are available. The former has a merit in the process in that the development and the detachment can be performed simultaneously. When exposed in liquid immersion, the overcoat is sometimes provided for the purpose of preventing elution of the additives such as acid generators from the resist and for the purpose of enhancing a water gliding property. As the overcoat, it is preferable to not dissolve in water and to dissolve in the alkali solution, and those obtained by dissolving a polymer compound having α-trifluoromethylhydroxy group in higher alcohol having 4 or more carbon atoms or an ether compound having 8-12 carbon atoms are used. The overcoat is formed by spin-coating the solution for the overcoat on the resist film after the pre-baking, and pre-baking. The thickness of the overcoat is preferably 10 to 200 nm.

When the overcoat is used, after the dry exposure or the exposure in liquid immersion, the post-exposure baking (PEB) is performed, and the development is performed in the alkali developer for 10 to 300 seconds. As the alkali developer, an aqueous solution of 2.38% by mass of tetramethylammonium hydroxide is generally used widely. When the overcoat soluble in the developer is used, the detachment of the overcoat and the development of the resist film are performed simultaneously.

When the liquid immersion exposure is performed, in order to completely remove the water on the overcoat before PEB, it is preferable to dry or collect the water on the overcoat by spin-dry, purge of surface by dry air or nitrogen before PEB, or by optimizing a water collection nozzle shape or a water collection process on the stage after the exposure. If the water on the protection film is completely removed before PEB, there is little possibility that a pattern can not be formed because the water pumps the acid out of the resist during PEB.

In the development, a paddle method or a dip method using the alkali aqueous solution is used, and in particular, the paddle method using the aqueous solution of 2.38% by mass of tetramethylammonium hydroxide is preferably used. The resist is developed at room temperature for 10 to 300 seconds, then rinsed with purified water and dried by spin-drying or nitrogen-blowing.

Subsequently, the resist lower layer film is etched by dry etching using the resist upper layer film on which the resist pattern has been formed as a mask. This etching can be performed by the standard methods. Inert gases such as He and Ar, as well as CO, $CO_2$, $NH_3$, $SO_2$, $N_2$ and $NO_2$ gases in addition to oxygen gas can be added. When the substrate is $SiO_2$ or SiN, the etching mainly using chlorofluorocarbon gas is performed. When the substrate is polysilicon (p-Si), Al or W, the etching mainly using chlorine or bromine based gas is performed. The resist lower layer film of the present invention has a feature that the etching speed is fast upon etching of the substrate.

The pattern is formed on the substrate by this etching.

In the above description, the photoresist composition was shown as the composition for forming the resist upper layer film, and the resist lower layer film composition of the present invention can also be used for forming the resist lower layer film for preventing the occurrence of the footing profile and the undercut of the resist in the case of using electron beam exposure other than the case of lithography.

EXAMPLES

The present invention will be specifically described with reference to the following Examples and Comparative Examples, but the present invention is not limited thereto.

Monomers 1 to 6 used in the following Synthesis Examples are shown blow.

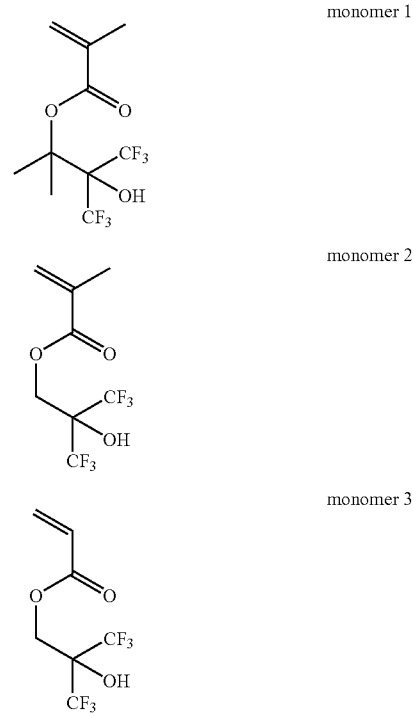

monomer 1 monomer 2 monomer 3 monomer 4

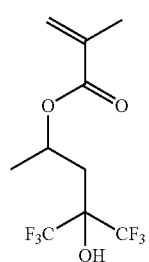

monomer 5

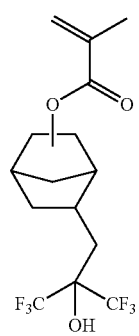

monomer 6

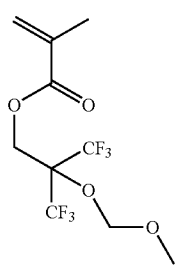

Synthesis Example 1

In a 100 mL flask, 8.8 g of monomer 1, 5.7 g of 2,3-epoxypropyl methacrylate ester, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.

Polymerization ratio:

monomer 1:2,3-epoxypropyl methacrylate ester:styrene=0.3:0.4:0.3

Molecular weight (Mw)=10,500

Dispersion degree (Mw/Mn)=1.76

This polymer was designated as polymer 1.

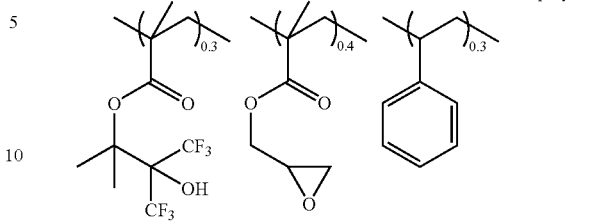

polymer 1

Synthesis Example 2

In a 100 mL flask, 8.0 g of monomer 2, 5.7 g of 2,3-epoxypropyl methacrylate ester, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.

Polymerization ratio:

monomer 2:2,3-epoxypropyl methacrylate ester:styrene=0.3:0.4:0.3

Molecular weight (Mw)=10,900

Dispersion degree (Mw/Mn)=1.85

This polymer was designated as polymer 2.

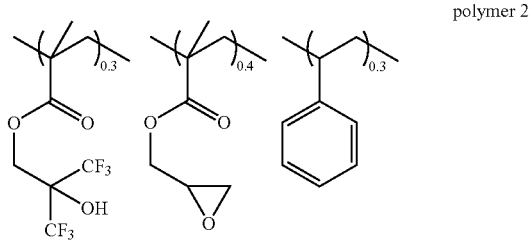

polymer 2

Synthesis Example 3

In a 100 mL flask, 7.6 g of monomer 3, 6.4 g of 2,3-dihydroxypropyl methacrylate ester, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.

Polymerization ratio:
  monomer 3:2,3-dihydroxypropyl methacrylate ester:styrene=0.3:0.4:0.3
  Molecular weight (Mw)=8,900
  Dispersion degree (Mw/Mn)=1.99
This polymer was designated as polymer 3.

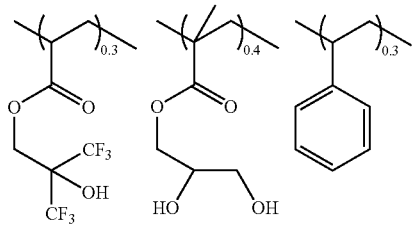

polymer 3

Synthesis Example 4

In a 100 mL flask, 8.8 g of monomer 4, 5.2 g of 2-hydroxyethyl methacrylate ester, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.
Polymerization ratio:
  monomer 4:2-hydroxyethyl methacrylate ester:styrene=0.3:0.4:0.3
  Molecular weight (Mw)=10,600
  Dispersion degree (Mw/Mn)=1.88
This polymer was designated as polymer 4.

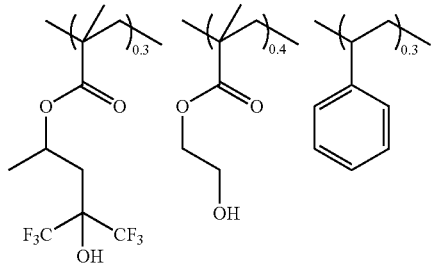

polymer 4

Synthesis Example 5

In a 100 mL flask, 7.6 g of monomer 2, 7.1 g of α-hydroxymethyl acrylate, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.
Polymerization ratio:
  monomer 2:α-hydroxymethyl acrylate=0.3:0.7
  Molecular weight (Mw)=9,200
  Dispersion degree (Mw/Mn)=1.79
This polymer was designated as polymer 5.

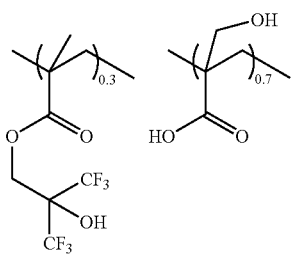

polymer 5

Synthesis Example 6

In a 100 mL flask, 8.8 g of monomer 1, 5.7 g of 2,3-epoxypropyl methacrylate ester, 3.6 g of 4-hydroxystyrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.
Polymerization ratio:
  monomer 1:2,3-epoxypropyl methacrylate ester:4-hydroxystyrene=0.3:0.4:0.3
  Molecular weight (Mw)=9,900
  Dispersion degree (Mw/Mn)=1.82
This polymer was designated as polymer 6.

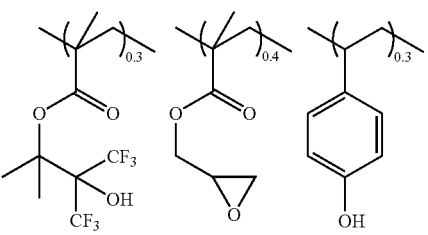

polymer 6

Synthesis Example 7

In a 100 mL flask, 7.6 g of monomer 2, 5.7 g of 2,3-epoxypropyl methacrylate ester, 4.1 g of phenylvinyl sulfide, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.
Polymerization ratio:
monomer 2:2,3-epoxypropyl methacrylate ester:phenylvinyl sulfide=0.3:0.4:0.3
Molecular weight (Mw)=9,500
Dispersion degree (Mw/Mn)=1.88
This polymer was designated as polymer 7.

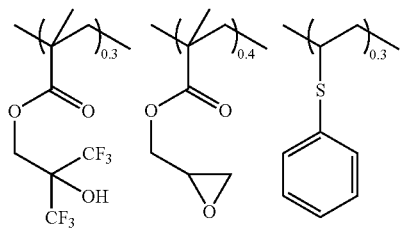

polymer 7

Synthesis Example 8

In a 100 mL flask, 7.6 g of monomer 2, 5.7 g of 2,3-epoxypropyl methacrylate ester, 5.3 g of benzyl methacrylate, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.
Polymerization ratio:
monomer 2:2,3-epoxypropyl methacrylate ester:benzyl methacrylate=0.3:0.4:0.3
Molecular weight (Mw)=11,000
Dispersion degree (Mw/Mn)=1.89
This polymer was designated as polymer 8.

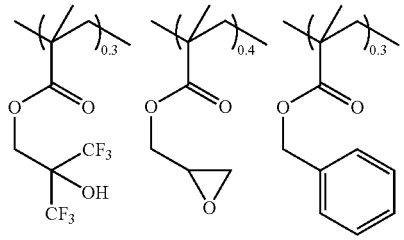

polymer 8

Synthesis Example 9

In a 100 mL flask, 7.6 g of monomer 2, 5.7 g of 2,3-epoxypropyl methacrylate ester, 8.1 g of 4-hexafluoroisopropylstyrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.
Polymerization ratio:
monomer 2:2,3-epoxypropyl methacrylate ester:4-hexafluoroisopropylstyrene=0.3:0.4:0.3
Molecular weight (Mw)=8,300
Dispersion degree (Mw/Mn)=1.75
This polymer was designated as polymer 9.

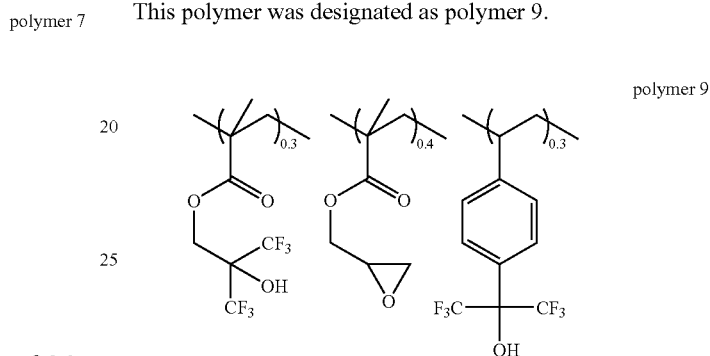

polymer 9

Synthesis Example 10

In a 100 mL flask, 7.6 g of monomer 2, 4.1 g of α-hydroxymethyl acrylate, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.
Polymerization ratio:
monomer 2:α-hydroxymethyl acrylate:styrene=0.3:0.4:0.3
Molecular weight (Mw)=8,900
Dispersion degree (Mw/Mn)=1.71
This polymer was designated as polymer 10.

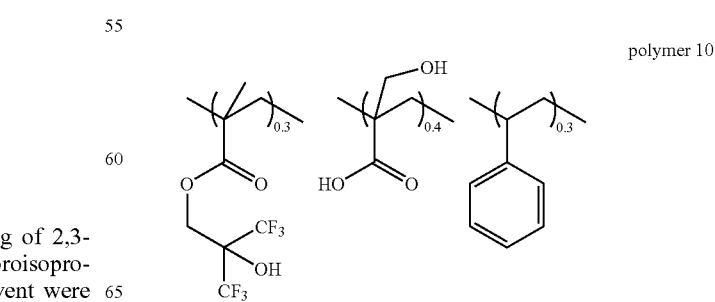

polymer 10

Synthesis Example 11

In a 100 mL flask, 7.6 g of monomer 2, 4.1 g of α-hydroxymethyl acrylate, 5.8 g of benzyl α-hydroxymethylacrylate eater, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.

Polymerization ratio:

monomer 2:α-hydroxymethyl acrylate:benzyl α-hydroxymethyl acrylate eater=0.3:0.4:0.3

Molecular weight (Mw)=9,600

Dispersion degree (Mw/Mn)=1.71

This polymer was designated as polymer 11.

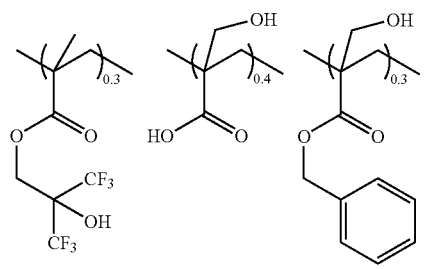

polymer 11

Synthesis Example 12

In a 100 mL flask, 8.0 g of monomer 2, 9.9 g of 2,3-epoxypropyl methacrylate ester, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.

Polymerization ratio:

monomer 2:2,3-epoxypropyl methacrylate ester=0.3:0.7

Molecular weight (Mw)=10,300

Dispersion degree (Mw/Mn)=1.80

This polymer was designated as polymer 12.

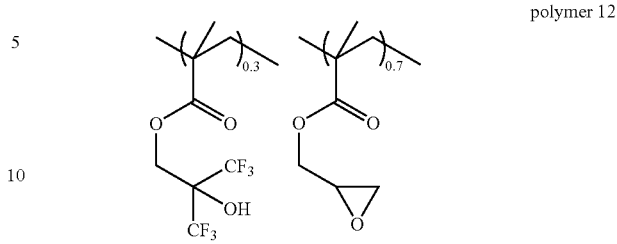

polymer 12

Synthesis Example 13

In a 100 mL flask, 9.3 g of monomer 6, 5.7 g of 2,3-epoxypropyl methacrylate ester, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by 13C, 1H-NMR and GPC, and the following results were obtained.

Polymerization ratio:

monomer 6:2,3-epoxypropyl methacrylate ester:styrene 0.3:0.4:0.3

Molecular weight (Mw)=10,4200

Dispersion degree (Mw/Mn)=1.72

This polymer was designated as polymer 13.

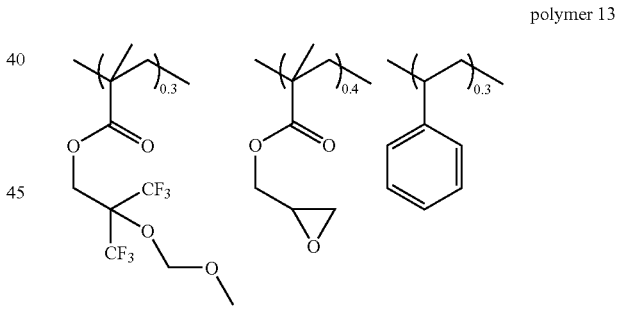

polymer 13

Synthesis Example 14

In a 100 mL flask, 9.3 g of monomer 1, 7.4 g of (3-ethyl-3-oxetanyl)methyl methacrylate, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.

Polymerization ratio:
monomer 1:(3-ethyl-3-oxetanyl)methyl methacrylate:styrene=0.3:0.4:0.3
Molecular weight (Mw)=8,300
Dispersion degree (Mw/Mn)=1.68
This polymer was designated as polymer 14.

polymer 14

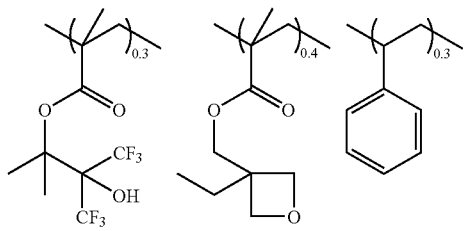

Synthesis Example 15

In a 100 mL flask, 9.3 g of monomer 1, 9.0 g of 3-oxo-2,7-dioxatricyclo[4.2.1.0$^{4,8}$]nonane-9-yl methacrylate, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, 1H-NMR and GPC, and the following results were obtained.
Polymerization ratio:
monomer 1:3-oxo-2,7-dioxatricyclo[4.2.1.0$^{4,8}$]nonane-9-yl methacrylate:styrene=0.3:0.4:0.3
Molecular weight (Mw)=8,600
Dispersion degree (Mw/Mn)=1.72
This polymer was designated as polymer 15.

polymer 15

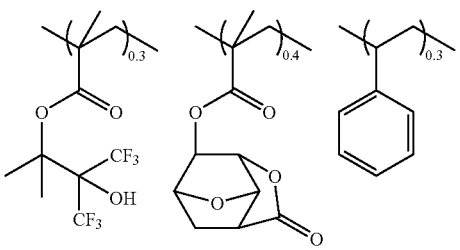

Synthesis Example 16

In a 100 mL flask, 9.3 g of monomer 1, 7.8 g of (7-oxanorbornane-2-yl)methyl methacrylate, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^1$H-NMR and GPC, and the following results were obtained.
Polymerization ratio:
monomer 1:(7-oxanorbornane-2-yl)methyl methacrylate:styrene=0.3:0.4:0.3
Molecular weight (Mw)=8,300
Dispersion degree (Mw/Mn)=1.76
This polymer was designated as polymer 16.

polymer 16

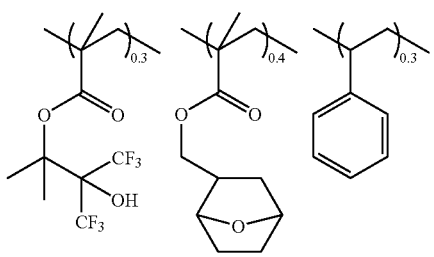

Synthesis Example 17

In a 100 mL flask, 9.3 g of monomer 1, 11.3 g of 2-(4,8-dioxa-5-oxotricyclo[4.2.1.0$^{3,7}$]nonane-2-yloxy)-2-oxoethyl methacrylate, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^1$H-NMR and GPC, and the following results were obtained.
Polymerization ratio:
monomer 1:2-(4,8-dioxa-5-oxotricyclo[4.2.1.0$^{3,7}$]nonane-2-yloxy)-2-oxoethyl methacrylate:styrene=0.3:0.4:0.3
Molecular weight (Mw)=8,300
Dispersion degree (Mw/Mn)=1.69

This polymer was designated as polymer 17.

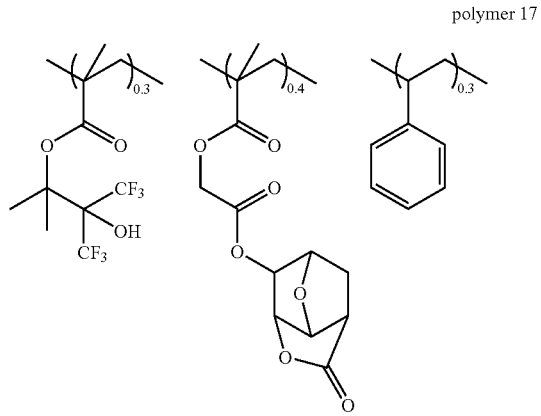

polymer 17

Comparative Synthesis Example 1

In a 100 mL flask, 9.9 g of 2,3-epoxypropyl methacrylate ester, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, 1H-NMR and GPC, and the following results were obtained.
Polymerization ratio:
2,3-epoxypropyl methacrylate ester:styrene=0.7:0.3
Molecular weight (Mw)=9,800
Dispersion degree (Mw/Mn)=1.81
This polymer was designated as comparative polymer 1.

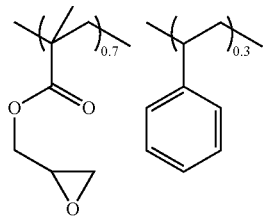

comparative polymer 1

Comparative Synthesis Example 2

In a 100 mL flask, 11.3 g of monomer 5, 5.7 g of 2,3-epoxypropyl methacrylate ester, 3.1 g of styrene, and 20 g of tetrahydrofuran as a solvent were added. This reaction vessel was cooled to −70° C. under nitrogen atmosphere, and deaeration under reduced pressure and nitrogen flow were repeated three times. 0.1 g of AIBN as a polymerization initiator was added after elevating to room temperature, the temperature was elevated to 60° C. and reacted for 15 hours. This reaction solution was poured in 100 mL of isopropyl alcohol to precipitate. A resulting white solid was filtrated, and then dried at 60° C. under reduced pressure to yield a white polymer.

The resulting polymer was analyzed by $^{13}$C, $^{1}$H-NMR and GPC, and the following results were obtained.
Polymerization ratio:
monomer 5:2,3-epoxypropyl methacrylate ester:styrene=0.3:0.4:0.3
Molecular weight (Mw)=9,600
Dispersion degree (Mw/Mn)=1.73
This polymer was designated as comparative polymer 2.

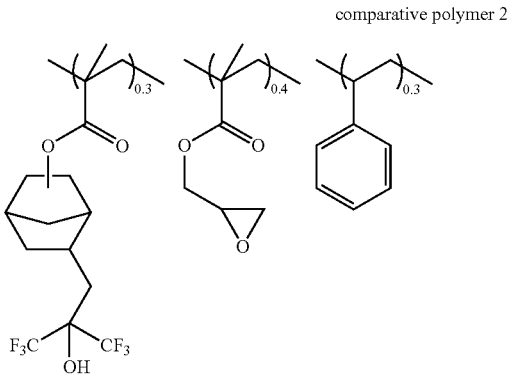

comparative polymer 2

[Preparation of Resist Lower Layer Film Composition]

A resist lower layer film composition (Examples 1 to 18, Comparative Examples 1 and 2) was each prepared by dissolving the polymer represented by the polymers 1 to 17 or the polymer represented by the comparative polymers 1 and 2, the acid generator represented by following AG1, AG2 or PAG1 and the crosslinking agent represented by following CR1 in the organic solvent containing 0.1% by mass of FC-4430 (manufactured by Sumitomo 3M.) at ratios shown in Table 1, and filtrating through a filter having a pore size of 0.1 μm and made from a fluorine resin.

A solution of each resist lower layer film composition (Examples 1 to 18, Comparative Examples 1 and 2) prepared above was applied onto a silicon substrate and baked at 200° C. for 60 seconds to form a resist lower layer film (antireflection film) having a film thickness of 80 nm.

After forming the resist lower layer film, a refractive indexes (n and k) at an wavelength of 193 nm was measured using a variable incident angle spectro-ellipsometer (VASE) supplied from J. A. Woolam Corp., and the results were shown in Table 1.

TABLE 1

| | Polymer (parts by mass) | Acid generator (parts by mass) | Crosslinking agent (parts by mass) | Organic solvent (parts by mass) | Refractive index n value | Refractive index k value |
|---|---|---|---|---|---|---|
| Example 1 | Polymer 1 (100) | AG1 (7.0) | — | PGMEA (2000) | 1.63 | 0.31 |
| Example 2 | Polymer 2 (100) | AG1 (7.0) | — | PGMEA (2000) | 1.63 | 0.33 |
| Example 3 | Polymer 3 (100) | AG1 (7.0) | CR1 (25) | PGMEA (2000) | 1.62 | 0.31 |

TABLE 1-continued

| | Polymer (parts by mass) | Acid generator (parts by mass) | Crosslinking agent (parts by mass) | Organic solvent (parts by mass) | Refractive index n value | Refractive index k value |
|---|---|---|---|---|---|---|
| Example 4 | Polymer 4 (100) | AG1 (7.0) | CR1 (25) | PGMEA (2000) | 1.65 | 0.32 |
| Example 5 | Polymer 5 (30) Polymer 1 (70) | AG1 (7.0) | — | PGMEA (2000) | 1.57 | 0.21 |
| Example 6 | Polymer 6 (100) | AG1 (7.0) | — | PGMEA (2000) | 1.65 | 0.30 |
| Example 7 | Polymer 7 (100) | AG1 (7.0) | — | PGMEA (2000) | 1.75 | 0.31 |
| Example 8 | Polymer 8 (100) | AG1 (7.0) | — | PGMEA (2000) | 1.61 | 0.29 |
| Example 9 | Polymer 9 (100) | AG1 (7.0) | — | PGMEA (2000) | 1.59 | 0.30 |
| Example 10 | Polymer 10 (100) | AG1 (7.0) | — | PGMEA (2000) | 1.64 | 0.31 |
| Example 11 | Polymer 11 (100) | AG1 (7.0) | — | PGMEA (2000) | 1.64 | 0.30 |
| Example 12 | Polymer 12 (100) | AG1 (7.0) | — | PGMEA (2000) | 1.64 | 0.30 |
| Example 13 | Polymer 2 (100) | AG2 (7.0) | CR1 (25) | PGMEA (2000) | 1.54 | 0.28 |
| Example 14 | Polymer 13 (100) | AG1 (7.0) | — | PGMEA (2000) | 1.64 | 0.30 |
| Example 15 | Polymer 14 (100) | AG1 (7.0) | — | PGMEA (2000) | 1.63 | 0.30 |
| Example 16 | Polymer 15 (100) | AG1 (7.0) | — | PGMEA (2000) | 1.63 | 0.32 |
| Example 17 | Polymer 16 (100) | AG1 (7.0) | — | PGMEA (2000) | 1.65 | 0.29 |
| Example 18 | Polymer 17 (100) | AG1 (7.0) | — | PGMEA (2000) | 1.64 | 0.29 |
| Comparative Example 1 | Comparative Polymer 1 (100) | PAG1 (6.6) | — | PGMEA (2000) | 1.72 | 0.35 |
| Comparative Example 2 | Comparative Polymer 2 (100) | PAG1 (6.6) | — | PGMEA (2000) | 1.66 | 0.32 |

In Table 1, respective compositions are as follows.

Polymers 1 to 17: from Synthesis Examples 1 to 17

Comparative polymers 1 and 2: from Comparative Synthesis Examples 1 and 2

Organic solvent: PGMEA (propylene glycol monomethyl ether acetate)

Crosslinking agent: CR1 (see the following structural formula)

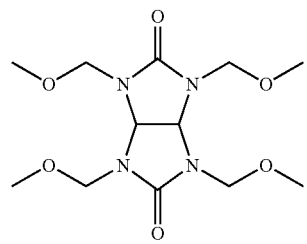

CR1

Acid generators: AG1 and AG2 (see the following structural formulae)

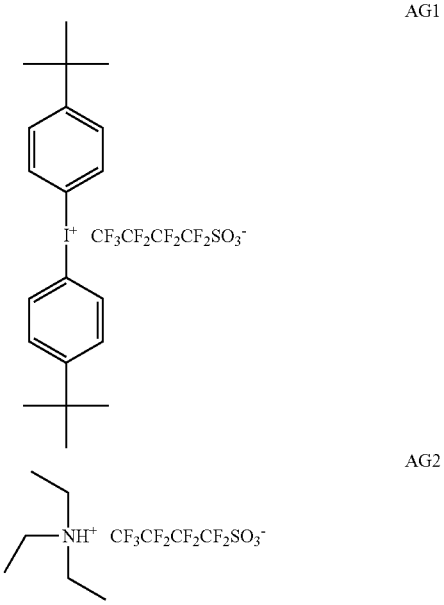

Acid generator: PAG1 (described later)

As shown in Table 1, in Examples 1 to 18, n value falls within the range of 1.5 to 1.8 and k value falls within the range of 0.2 to 0.45 in the refractive index of the resist lower layer film, and particularly it has been found that the resist lower layer film has the optimal refractive index (n) and extinction coefficient (k) enough to exert the sufficient antireflection effect at a film thickness of 30 nm or more.

[Evaluation of Dry Etching Resistance]

In tests for evaluating the dry etching resistance, the solution of each resist lower layer film composition (Examples 1 to 18, Comparative Examples 1 and 2) prepared above was applied onto the silicon substrate and baked at 200° C. for 60 seconds to form a resist lower layer film having the film thickness of 150 nm.

This resist lower layer film was etched in $CHF_3/CF_4$ gas using a dry etching apparatus TE-8500P manufactured by Tokyo Electron Ltd., and a film thickness difference before and after the etching was calculated. The obtained results are shown in Table 2.

Etching conditions are as follows

Chamber pressure: 40.0 Pa

RF power: 1,300 W

Gap: 9 mm $CHF_3$ gas flow: 30 mL/minute $CF_4$ gas flow: 30 mL/minute

Ar gas flow: 100 mL/minute

Time period: 20 seconds

TABLE 2

| Resist lower layer film | Film thickness difference by $CHF_3/CF_4$ etching (nm) |
| --- | --- |
| Example 1 | 71 |
| Example 2 | 75 |
| Example 3 | 80 |
| Example 4 | 60 |
| Example 5 | 70 |
| Example 6 | 74 |
| Example 7 | 76 |
| Example 8 | 85 |
| Example 9 | 78 |
| Example 10 | 80 |
| Example 11 | 88 |
| Example 12 | 68 |
| Example 13 | 75 |
| Example 14 | 70 |
| Example 15 | 75 |
| Example 16 | 77 |
| Example 17 | 76 |
| Example 18 | 79 |
| Comparative Example 1 | 48 |
| Comparative Example 2 | 52 |

As shown in Table 2, it has been found that the resist lower layer film of the present invention has the feature that the etching speed is fast.

[Evaluation of Resist Patterning]

A solution of an ArF monolayer resist composition was prepared by dissolving an ArF monolayer resist polymer 1 in the organic solvent containing 0.1% by mass of FC-4430 (manufactured by Sumitomo 3M.) at ratios shown in Table 3, and filtrating through the filter having the pore size of 0.1 μm and made from the fluorine resin.

TABLE 3

| Polymer (parts by mass) | Acid generator (parts by mass) | Basic compound (parts by mass) | Organic solvent (parts by mass) |
| --- | --- | --- | --- |
| ArF monolayer resist composition ArF monolayer resist polymer 1 (100) | PAG1 (10.0) | Quencher 1 (1.2) | PGMEA (1800) |

Respective compositions in Table 3 are as follows. ArF monolayer resist polymer 1 (see the following structural formula)

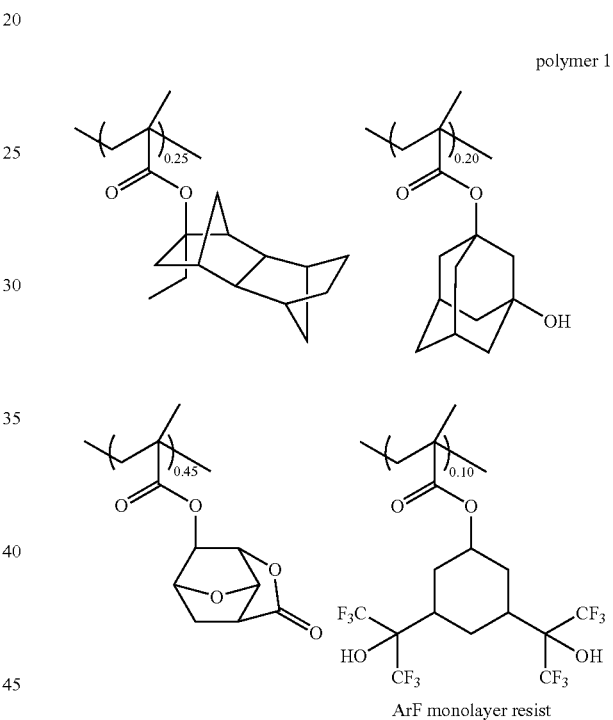

ArF monolayer resist

Acid generator PAG 1 (see the following structural formula)

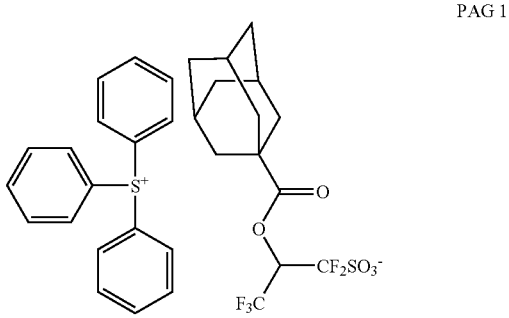

Basic compound: Quencher 1 (see the following structural formula)

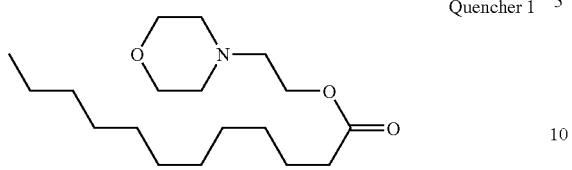

Quencher 1

Organic solvent: PGMEA (propylene glycol monomethyl ether acetate)

The solution of the resist lower layer film composition (Examples 1 to 18, Comparative Examples 1 and 2) prepared above was applied onto a Si substrate and baked at 200° C. for 60 seconds to form a resist lower layer film (antireflection film) 80 nm thick. The solution of the ArF monolayer resist composition was applied onto this resist lower layer film and pre-baked at 110° C. for 60 seconds to form a photoresist film 150 nm thick. Then, the photoresist film was exposed using an ArF exposure apparatus (manufactured by Nikon Corporation: S307E, NA 0.85, σ 0.93, cycle light ⅔, 6% half tone phase shift), baked (PEB) at 100° C. for 60 seconds and developed with the aqueous solution of 2.38% by mass of tetramethylammonium hydroxide (TMAH) for 60 seconds to afford a positive type pattern. A sectional shape of the resulting pattern of 80 nm lines and spaces was observed. The results are shown in Table 4.

TABLE 4

| Resist lower layer film | Cross-sectiona shape of photoresist film |
| --- | --- |
| Example 1 | Rectangular shape, no footing profile |
| Example 2 | Rectangular shape, no footing profile |
| Example 3 | Rectangular shape, no footing profile |
| Example 4 | Rectangular shape, no footing profile |
| Example 5 | Rectangular shape, no footing profile |
| Example 6 | Rectangular shape, no footing profile |
| Example 7 | Rectangular shape, no footing profile |
| Example 8 | Rectangular shape, no footing profile |
| Example 9 | Rectangular shape, no footing profile |
| Example 10 | Rectangular shape, no footing profile |
| Example 11 | Rectangular shape, no footing profile |
| Example 12 | Rectangular shape, no footing profile |
| Example 13 | Rectangular shape, no footing profile |
| Example 14 | Rectangular shape, no footing profile |
| Example 15 | Rectangular shape, no footing profile |
| Example 16 | Rectangular shape, no footing profile |
| Example 17 | Rectangular shape, no footing profile |
| Example 18 | Rectangular shape, no footing profile |
| Comparative Example 1 | footing profile |
| Comparative Example 2 | Rectangular shape, no footing profile |

As shown in Table 4, it could been confirmed that an excellent resist pattern having a rectangular shape with no footing profile was formed on the photoresist film on the resist lower layer film (antireflection film) formed using the resist lower layer film composition of the present invention.

The present invention is not limited to the above-described embodiments. The above-described embodiments are some examples, and those having the substantially same composition as that described in the appended claims and providing the similar effects are included in the scope of the present invention.

The invention claimed is:

1. A substrate comprising, at least:

a resist lower layer film on a substrate, the resist lower layer film formed from a resist lower layer film composition comprising:

at least a polymer having a repeating unit represented by the following general formula (1),

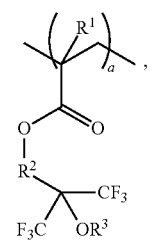

(1)

(wherein $R^1$ represents a hydrogen atom or a methyl group; $R^2$ represents a linear or branched alkylene group having 1-8 carbon atoms; $R^3$ represents a hydrogen atom or an acid labile group; and $0<a\leq 1.0$), and further containing one or more of an organic solvent, an acid generator, and a crosslinking agent; and a photoresist film formed on the resist lower layer film.

2. The substrate according to claim 1, wherein the resist lower layer film serves as an antireflection film.

3. The substrate according to claim 1, wherein the polymer further comprises a repeating unit having a light absorbing group of an aromatic group.

4. The substrate according to claim 1, wherein the acid generator is an ammonium salt represented by the following general formula (2),

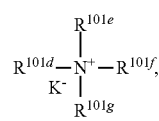

(2)

wherein $R^{101d}$, $R^{101e}$, $R^{101f}$ and $R^{101g}$ each represent a hydrogen atom, a linear, branched or cyclic alkyl, alkenyl, oxoalkyl or oxoalkenyl group having 1-12 carbon atoms, an aryl group having 6-20 carbon atoms, or an aralkyl or aryloxoalkyl group having 7-12 carbon atoms where a part of or all of hydrogen atoms may be substituted with an alkoxy groups(s); $R^{101d}$ and $R^{101e}$, or $R^{101d}$, $R^{101e}$ and $R^{101f}$ may form a ring, and when forming the ring, $R^{101d}$ and $R^{101e}$, or $R^{101d}$, $R^{101e}$ and $R^{101f}$ each represent an alkylene group having 3-10 carbon atoms or a heterocyclic aromatic ring having the nitrogen atom in the formula in the ring; and $K^-$ represents a non-nucleophilic counter ion.

5. The substrate according to claim 2, wherein the polymer further comprises a repeating unit having a light absorbing group of an aromatic group.

6. The substrate according to claim 2, wherein the acid generator is an ammonium salt represented by the following general formula (2),

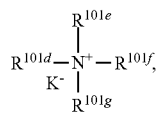

(2)

wherein $R^{101d}$, $R^{101e}$, $R^{101f}$ and $R^{101g}$ each represent a hydrogen atom, a linear, branched or cyclic alkyl, alkenyl, oxoalkyl or oxoalkenyl group having 1-12 carbon atoms, an aryl group having 6-20 carbon atoms, or an aralkyl or aryloxoalkyl group having 7-12 carbon atoms where a part of or all of hydrogen atoms may be substituted with an alkoxy group(s); $R^{101d}$ and $R^{101e}$, or $R^{101d}$, $R^{101e}$ and $R^{101f}$ may form a ring, and when forming the ring, $R^{101d}$ and $R^{101e}$, or $R^{101d}$, $R^{101e}$ and $R^{101f}$ each represent an alkylene group having 3-10 carbon atoms or a heterocyclic aromatic ring having the nitrogen atom in the formula in the ring; and $K^-$ represents a non-nucleophilic counter ion.

7. The substrate according to claim 3, wherein the acid generator is an ammonium salt represented by the following general formula (2),

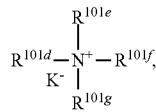

(2)

wherein $R^{101d}$, $R^{101e}$, $R^{101f}$ and $R^{101g}$ each represent a hydrogen atom, a linear, branched or cyclic alkyl, alkenyl, oxoalkyl or oxoalkenyl group having 1-12 carbon atoms, an aryl group having 6-20 carbon atoms, or an aralkyl or aryloxoalkyl group having 7-12 carbon atoms where a part of or all of hydrogen atoms may be substituted with an alkoxy group(s); $R^{101d}$ and $R^{101e}$, or $R^{101d}$, $R^{101e}$ and $R^{101f}$ may form a ring, and when forming the ring, $R^{101d}$ and $R^{101e}$, or $R^{101d}$, $R^{101e}$ and $R^{101f}$ each represent an alkylene group having 3-10 carbon atoms or a heterocyclic aromatic ring having the nitrogen atom in the formula in the ring; and $K^-$ represents a non-nucleophilic counter ion.

8. The substrate according to claim 5, wherein the acid generator is an ammonium salt represented by the following general formula (2),

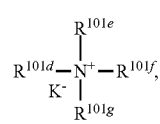

(2)

wherein $R^{101d}$, $R^{101e}$, $R^{101f}$ and $R^{101g}$ each represent a hydrogen atom, a linear, branched or cyclic alkyl, alkenyl, oxoalkyl or oxoalkenyl group having 1-12 carbon atoms, an aryl group having 6-20 carbon atoms, or an aralkyl or aryloxoalkyl group having 7-12 carbon atoms where a part of or all of hydrogen atoms may be substituted with an alkoxy group(s); $R^{101d}$ and $R^{101e}$, or $R^{101d}$, $R^{101e}$ and $R^{101f}$ may form a ring, and when forming the ring, $R^{101d}$ and $R^{101e}$, or $R^{101d}$, $R^{101e}$ and $R^{101f}$ each represent an alkylene group having 3-10 carbon atoms or a heterocyclic aromatic ring having the nitrogen atom in the formula in the ring; and $K^-$ represents a non-nucleophilic counter ion.

\* \* \* \* \*